United States Patent [19]
Lee et al.

[11] Patent Number: 5,914,896
[45] Date of Patent: Jun. 22, 1999

[54] FLASH MEMORY WITH HIGH SPEED ERASING STRUCTURE USING THIN OXIDE AND THICK OXIDE SEMICONDUCTOR DEVICES

[75] Inventors: Peter W. Lee, Saratoga, Calif.; Fu-Chang Hsu; Hsing-Ya Tsao, both of Taipei, Taiwan

[73] Assignee: Aplus Flash Technology, Inc., Santa Clara, Calif.

[21] Appl. No.: 08/915,344

[22] Filed: Aug. 22, 1997

Related U.S. Application Data

[63] Continuation-in-part of application No. 08/691,281, Aug. 1, 1996, Pat. No. 5,796,657, application No. 08/744,200, Nov. 5, 1996, application No. 08/772,232, Dec. 23, 1996, application No. 08/779,765, Jan. 7, 1997, abandoned, application No. 08/814,913, Mar. 11, 1997, application No. 08/823,571, Mar. 25, 1997, application No. 08/872,475, Jun. 5, 1997, Pat. No. 5,777,924, and application No. 08/882,558, Jun. 25, 1997.

[51] Int. Cl.[6] .................................................. G11C 16/00
[52] U.S. Cl. ................................ 365/185.19; 365/185.28; 365/185.29; 365/185.23
[58] Field of Search ......................... 365/185.29, 185.19, 365/185.22, 185.23, 185.28, 185.33

[56] References Cited

U.S. PATENT DOCUMENTS

| 4,357,685 | 11/1982 | Daniele et al. | 365/185.22 |
|---|---|---|---|
| 5,485,423 | 1/1996 | Tang et al. | 365/185.19 |
| 5,532,960 | 7/1996 | Lin et al. | 365/185.29 |
| 5,561,683 | 10/1996 | Fong | 365/185.23 |
| 5,568,419 | 10/1996 | Atsumi et al. | 365/185.22 |
| 5,587,947 | 12/1996 | Chang et al. | 365/185.3 |
| 5,600,593 | 2/1997 | Fong | 365/185.19 |
| 5,703,807 | 12/1997 | Smayling et al. | 365/185.03 |
| 5,712,819 | 1/1998 | Harai | 365/185.29 |
| 5,721,704 | 2/1998 | Morton | 365/185.23 |

*Primary Examiner*—Tan T. Nguyen
*Attorney, Agent, or Firm*—Flehr Hohbach Test Albritton & Herbert LLP

[57] ABSTRACT

A flash memory with a high speed erasing structure includes a bank of flash transistors having a plurality of wordlines, a plurality of bitlines and a sourceline. A wordline decoder is coupled to the wordlines and configured to selectively apply voltages to the wordlines to perform procedures on the flash transistors, where the procedures include a read procedure, an erase procedure and a program procedure. During the erase procedure, the wordline decoder is configured to apply a first increasingly negative voltage in a first voltage range to at least one selected wordline until a first threshold voltage is met, then to apply a second increasingly negative voltage in a second voltage range to the selected wordline and to simultaneously apply a third negative voltage in a third voltage range to at least one deselected wordline. Another embodiment of the invention increases the selected sourceline voltage to achieve a high voltage differential between the gate and source of flash transistors selected to be erased. In another second embodiment, the wordline decoder is constructed from thin oxide and thick oxide semiconductor devices. Thick oxide devices are used in the wordline driver, which allows an increased voltage differential to be applied to the wordlines without damaging the wordline driver. Advantages of the invention include a fast erasing procedure due to the increased voltage differential applied between the gate and source of flash transistors selected to be erased.

42 Claims, 18 Drawing Sheets

Erase time (linear)

Program time (linear)

FLASH MEMORY WITH HIGH SPEED ERASING STRUCTURE USING THIN OXIDE AND THICK OXIDE SEMICONDUCTOR DEVICES

REFERENCE TO RELATED APPLICATIONS

This is a continuation in part of the following applications and incorporates these applications herein by reference:

U.S. Ser. No. 08/691,281 filed on Aug. 1, 1996, now U.S. Pat. No. 5,796,657;

U.S. Ser. No. 08/744,200 filed on Nov. 5, 1996;

U.S. Ser. No. 08/772,232 filed on Dec. 23, 1996;

U.S. Ser. No. 08/779,765 filed Jan. 7, 1997; abandoned

U.S. Ser. No. 08/814,913 filed Mar. 11, 1997;

U.S. Ser. No. 08/823,571 filed Mar. 25, 1997;

U.S. Ser. No. 08/872,475 filed Jun. 5, 1997, now U.S. Pat. No. 5,777,924; and

U.S. Ser. No. 08/882,558 filed Jun. 25, 1997.

FIELD

The present invention relates to a flash memory with a high speed erasing structure and method. In particular, the invention applies selected voltages to the memory array wordlines, sourcelines or bitlines to increase the voltage differential across the tunnel oxide of cells to be erased in order to reduce erase time. The invention permits the peripheral devices to operate at a relatively high voltage range compared to conventional memories, while still using a thin oxide semiconductor device technology, or a combination of thin oxide and thick oxide semiconductor technology.

BACKGROUND

Flash memories are becoming increasingly popular. However, some persistent drawbacks exist with conventional flash memories. For example, many conventional flash memories employ a large block erase limitation that is capable of erasing no less than a block of the memory at a time and re-programming the entire block with new data, even if only a small portion of the block needs to be re-programmed. Due to this relatively large re-programming technique, conventional flash memories are slow to respond and cannot achieve a large number of erase/program cycles due to the stress on the memory cells inherent in the erasing and programming cycles.

Another limitation is that flash transistor erasing time is exponentially longer with a less negative erase voltage or a lower transistor threshold voltage. This is because the electric field in the transistor that causes the electron transfer to the floating gate will vary based on the applied voltages and the transistor threshold voltage. For example, the time required to erase a flash transistor will be longer if −9 V is applied to the gate rather than −10 V. And, for example, the time required to reduce a flash transistor threshold (Vt) from 2 V to 1 V is approximately ten times the time required to reduce the threshold from 3 V to 2 V. Some techniques of reducing this time are by applying a greater negative voltage (e.g. <−10 V) if the erase procedure is to remove electrons from the floating gate, or a greater positive voltage (e.g. >15 V) to the wordline (transistor gates) if the erase procedure is to add electrons to the floating gate. Such techniques are described in U.S. Pat. No. 5,481,494 incorporated herein by reference. FIG. 1A shows a known technique that applies a fixed erase voltage of −10 V to the selected wordline (gate) for the entire erase procedure. Since the initial Vt is about 4 V greater than the final Vt after the completion of the erase procedure, the cell's tunnel oxide suffers the greatest electric stress at the beginning of the erase procedure, thus causing the hole trapping and oxide degradation. As a result, the flash transistor endurance is significantly reduced.

Another known flash memory, described in U.S. Pat. No. 5,485,423 incorporated herein by reference and shown in FIG. 1B, employs a stepwise decreasing voltage to the selected wordline (transistor gates) in order to reduce the possibility of hole trapping in the tunnel oxide and oxide degradation. This technique reduces the applied voltage in a stepwise fashion thereby reducing the high electrical field at the beginning of the erase procedure. Once the maximum negative voltage is achieved (e.g. −9.5 V), that voltage is applied until the erasure is complete. Although this technique significantly reduces oxide degradation, the erase time is still exponentially long when the lower erase threshold voltage (Vt) is required.

One feature common to the known flash memories of FIGS. 1A and 1B is that the deselected wordlines and sourcelines maintain a fixed voltage (e.g. 0 V) during the erase procedure. The wordline drivers of these circuits may experience significant stress due to the large voltage differential between the driven lines and the non-driven lines if the voltages of wordlines or sourcelines are increased. Such stress can cause device junction breakdown and may cause premature degradation or failure of the wordline driver.

The most negative or positive voltage of the selected wordline is limited by the maximum tolerance of the breakdown voltage (BVDSS) of PMOS and NMOS devices in the X-decoder wordline drivers. In particular, the BVDSS is determined by the voltage drop between two power supplies connected to M20a, M20b and M21a, M21b as shown in FIGS. 5A–B. The voltage drop across the two power supplies is equivalent to the voltage difference Vg(diff) between the selected wordline Vg(sel) and deselected wordline Vg(desel). If Vg(diff) exceeds the junction gated breakdown of the driver device (BVDSS), then large current will leak to the substrate until Vg(diff) drops to lower than (BVDSS). This is particularly relevant for thin oxide semiconductor devices which are conventionally used in flash memory circuits and where the maximum Vg(diff) is approximately +/−10 V. However, this voltage difference is not sufficient to provide fast erasing at low threshold voltages below approximately 3 V.

One further limitation of conventional flash memories is that the voltage across the cells' tunnel oxide is reduced when hole and electron trapping occurs after thousands of program and erase cycles. The wordline or sourceline voltages have to be increased to compensate for the electric field drop induced by the trappings.

Goals of the invention are to overcome the identified problems and to provide a new technique to quickly erase selected portions of the flash memory and improve the life of the flash memory.

SUMMARY

The invention overcomes the identified problems and provides a flash memory with a fast erase procedure and long life. A flash memory with a high speed erasing structure according to an embodiment of the invention includes a bank of flash transistors having a plurality of wordlines, a plurality of bitlines and a sourceline. A wordline decoder is coupled to the wordlines and configured to selectively apply voltages to the wordlines to perform procedures on the flash transistors, where the procedures include a read procedure, an erase procedure and a program procedure. During the erase procedure, the wordline decoder is configured to apply a first increasingly negative voltage in a first voltage range to at least one selected wordline until a first threshold voltage is met, then to apply a second increasingly negative voltage in a second voltage range to the selected wordline and to simultaneously apply a third negative voltage in a third voltage range to at least one deselected wordline. Another embodiment of the invention increases the selected sourceline voltage to achieve a high voltage differential between the gate and source of flash transistors selected to be erased.

In a second embodiment, the wordline decoder is constructed from thin oxide and thick oxide semiconductor devices. Thick oxide devices are used in the wordline driver, which allows an increased voltage differential to be applied to the wordlines without damaging the wordline driver. For example, a selected wordline can be applied with a high voltage in excess of 10 V while deselected wordlines can be maintained at VSS (0 V).

The exemplary embodiments can be combined with a voltage pump generator. A voltage pump generator provides operational voltages that are derived from the supplied voltages. For example, if the memory is supplied with +3 V, and needs −12 V for an erase procedure, the voltage pump generator creates the required voltage and provides it to the decoder circuits to accomplish the necessary procedure. Likewise, the voltage pump can provide a high positive voltage to the decoder circuits for the program procedure.

Advantages of the invention include a fast erasing procedure due to the increased voltage differential applied between the gate and source of flash transistors selected to be erased. Moreover, since the deselected wordlines are also ramped to a negative voltage, stress is reduced on the deselected wordline drivers, thereby increasing the longevity of the flash memory.

BRIEF DESCRIPTION OF THE FIGURES

Additional advantages of the invention will become apparent upon reading the following detailed description and upon reference to the drawings, in which.

DETAILED DESCRIPTION

Exemplary embodiments are described with reference to specific configurations. Those skilled in the art will appreciate that various changes and modifications can be made while remaining within the scope of the claims. For example, the invention can be used in any flash memory such as those including stacked-gate Flash cells, split-gate Flash cells, EEPROM, EPROM, BN+ cells, P-channel cells, or other types of flash cells. The invention can be also used in any memory array, including NOR-plane, NAND-plane, AND-plane, DINOR, dual-string NOR, or other types of memory arrays. All electrical parameters are given by example and can be modified with good results.

A. Flash Memory Architecture

Figure 2A:
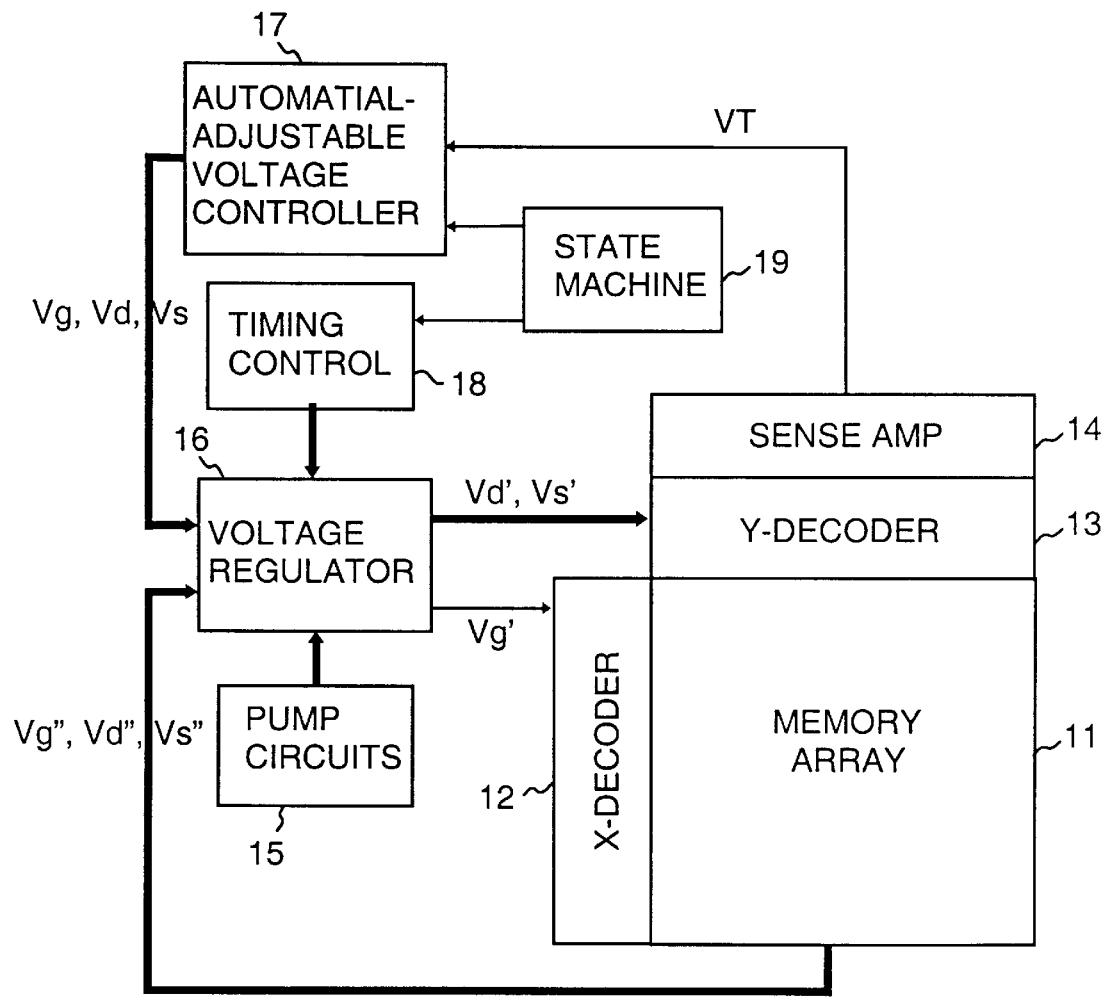
FIG. 2A depicts a flash memory according to an embodiment of the invention.
Figure 2B:
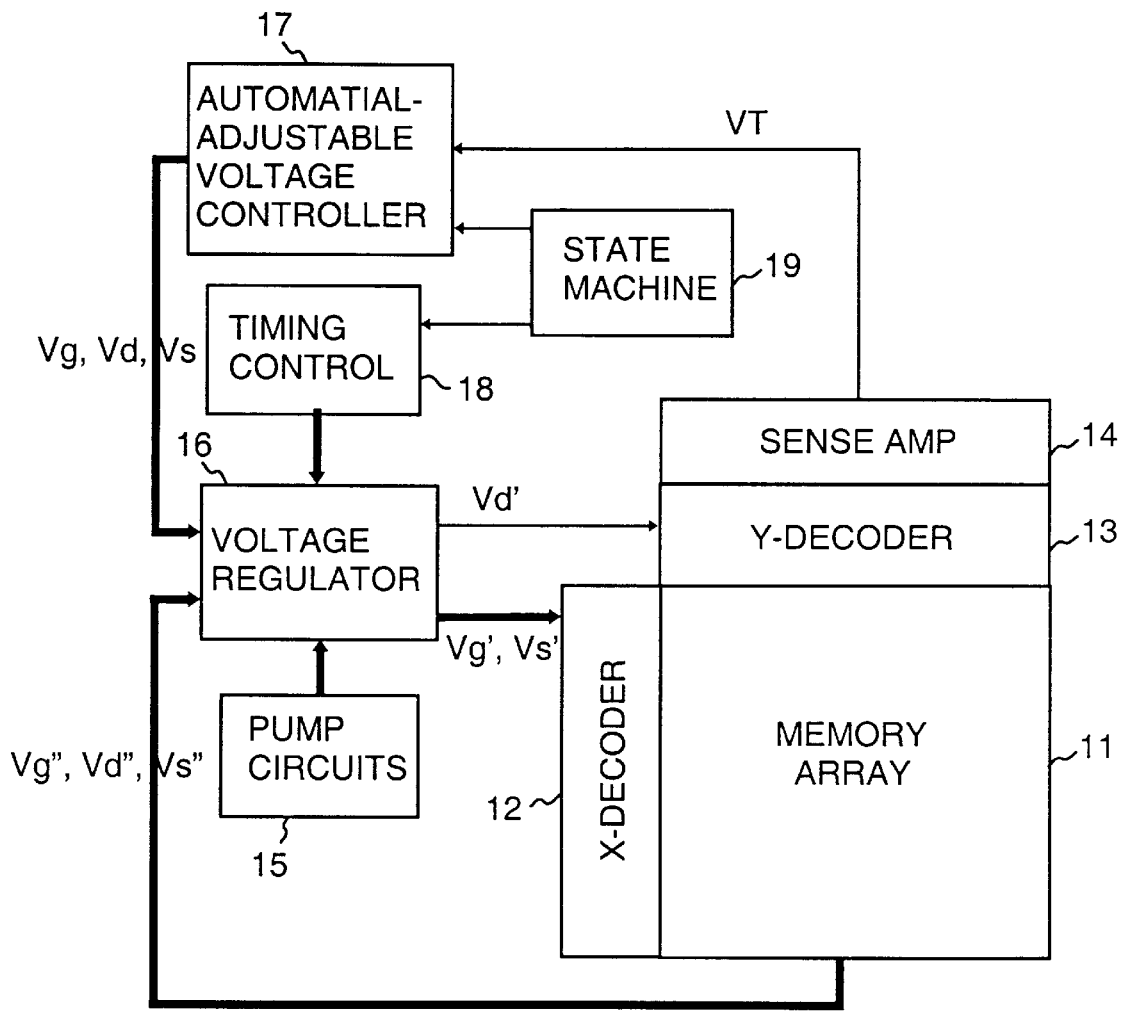
FIG. 2B depicts a flash memory according to an embodiment of the invention.

A first embodiment is described with reference to FIG. 2. The flash memory includes a memory array 11 that has a plurality of wordlines, bitlines and at least one sourceline. The memory array 11 is constructed similarly to a conventional NOR-plane array. An X-decoder 12 is coupled to the wordlines of array 11 and serves to apply operational voltages to selected and deselected wordlines. A Y-decoder 13 is coupled to the bitlines of array 11 and serves to pass selected bitlines to a sense amplifier 14. In an exemplary configuration, the sourceline is controlled by the Y-decoder (e.g. the sourceline decoder is within the Y-decoder), but could also be controlled by the X-decoder or by a separate sourceline decoder if desired.

A voltage pump circuit 15 is coupled to a voltage regulator 16 for supplying a variety of voltages to the memory. Voltage pump circuits are known in the art and example is given by way of reference to U.S. Pat. Nos. 4,679,134 and 4,812,961. Additional type pumps that can be incorporated in the invention are described in U.S. Ser. No. 08/744,200; U.S. Ser. No. 08/772,232; and U.S. Ser. No. 08/898,489. The incorporation of a pump generator with the exemplary embodiments expands the operational voltages in order to facilitate improved yield and operation of the memory.

For example, if the memory is supplied with VDD (+3.3 V), and needs VPP (+10 V) and VNN (−10 V) and other voltages such as +5 V, the voltage pump generator creates the needed voltage and provides it to the decoder circuits to accomplish the necessary function. In some cases, the voltage pump may provide voltages in excess of +10 V, such as +14 V, +20 V or more, or below −10 V, such as −14 V, −20 V or more.

Also included in the flash memory are an automatically adjustable voltage controller 17, a timing controller 18 and a state machine 19. These components are configured to deliver predetermined voltages to the decoder circuits 12, 13 and array 11 as needed to perform a desired procedure. The function of these circuits is discussed in greater detail below.

B. Erase Procedure

High speed erasing is an important improvement in flash memory technology. It is relevant to note that by decreasing the voltage applied to a tunnel oxide (more negative) the electrical field is increased. The relationship between the electrical field E and the tunnel current J is given by $J=AE^2*EXP(-B/E)$ where A and B are constants. If the coupling ratio from poly2 (wordline) to poly1 (floating gate) is about 50% then a 2 V decrease on a wordline, such as from −8 V to −10 V, will result in a 10 fold increase in the erasing current because of the log relationship between electric field E and tunneling current J.

The invention, therefore, significantly decreases the selected wordline voltage to very low voltages to speed the erase procedure. However, as stated above and worth repeating here is that the best way to avoid device breakdown when further increasing or decreasing the voltage on selected wordlines beyond the specified BVDSS is to also increase or decrease the voltage on deselected wordlines. See, for example, FIG. 6B (described in detail below) where the two power inputs on lines 72a and 72b are connected to the wordlines 73a and 73b respectively. These two power inputs are connected to the source of M20a and M21a or M20b and M21b as indicated in FIG. 6B. Therefore, reducing the voltage across the source nodes of M20a and M21a is equivalent to reducing the voltage difference between selected wordlines and deselected wordlines. The invention provides a technique to lower both the selected wordline voltage Vg(sel) and the deselected wordline voltage Vg(desel) in order to maintain the differential voltage Vg(diff) below the breakdown voltage. As a result, the invention provides high erase speed while protecting the integrity of the wordline driver circuit. Moreover, the lower selected voltage Vg(sel) also quickens the erase times for low threshold voltages such as from 2 V to 1 V. The lower erase-state Vt means lower read voltage can be realized. Hence, the flash memory power consumption can also be significantly reduced.

Figure 3A:
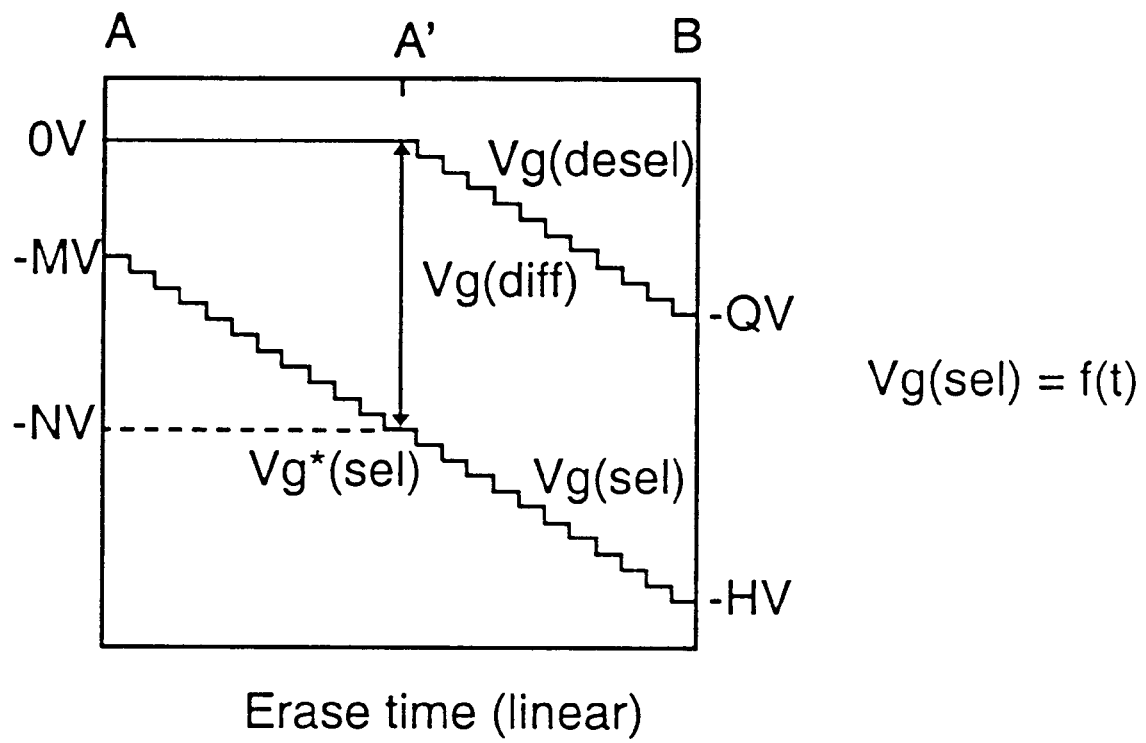
FIGS. 3A–C depict wordline voltages applied according to an embodiment of the invention.

FIG. 3A depicts exemplary voltages applied to flash memory wordlines according to an embodiment of the invention. During an exemplary erase procedure the applied sourceline voltage is typically positive, on the order of +5 V, and the bitline is disconnected and allowed to float. The voltage for the selected wordline Vg(sel) is ramped in region A–A' from an initial voltage –MV to a voltage –NV. This voltage is delivered to the array 11 via the X-decoder 12. The voltage ramp function is performed by the timing control 18 and state machine 19.

At the point A', if the erase verification fails within the allowed erase time, the Vg(desel) is decreased one step Vg(desel)–ΔVg, and then Vg(sel)–ΔVg where ΔVg is approximately 0.2 V. Note that the deselected wordline voltage is stepped before the selected wordline. This order is beneficial to insure that the voltage difference remains below BVDSS. Then the erase and verification is repeated again. This process iterates until Vg(sel) reaches –HV and Vg(desel) reaches –QV. If the erase verification still fails, then the part is considered to be defective. One reason to increase the voltage of Vg(desel) or Vg(sel) is to speed up the slowest erase cells or the high hole trapping cells.

At the point A', the voltage for the deselected wordlines Vg(desel) is also ramped from an initial voltage of 0 V to a voltage of –QV. This voltage is also delivered to the array 11 via the X-decoder 12, and the voltage ramp function is performed by the timing control 18 and state machine 19. From point A'–B, Vg(sel) is further ramped from the voltage –NV to the lower negative voltage –HV and Vg(desel) is ramped to the negative voltage –QV.

When ramping the wordline voltages, Vg(desel) decreases one step first and then Vg(sel) follows the same voltage step to insure that the voltage difference between Vg(sel) and Vg(desel) remains less than BVDSS. This serves the two goals of reducing the initial voltage difference between Vg(sel) and Vs (source voltage) in order to avoid hole trapping in the oxide, and of permitting the Vg(sel) voltage to be lowered to –HV while keeping Vg(diff) below the breakdown voltage (BVDSS).

The invention performs two functions in order to quicken the erase time. First, the invention can drive Vg(sel) to a highly negative voltage such as –12 V, –14 V, –16 V, –18 V, –20 V or more. This causes a large voltage differential between the gates and sources of the selected flash transistors thereby creating a strong electrical field that quickens the erase. Second, the invention lowers the voltage on the deselected wordlines Vg(desel) to –QV in order to reduce the possibility of a device breakdown in the X-decoder 12. There are two general techniques for providing the erase procedure, the first is time based and the second is threshold voltage based.

(a) Standard Erase Procedure (Time Based)

Figure 3B:
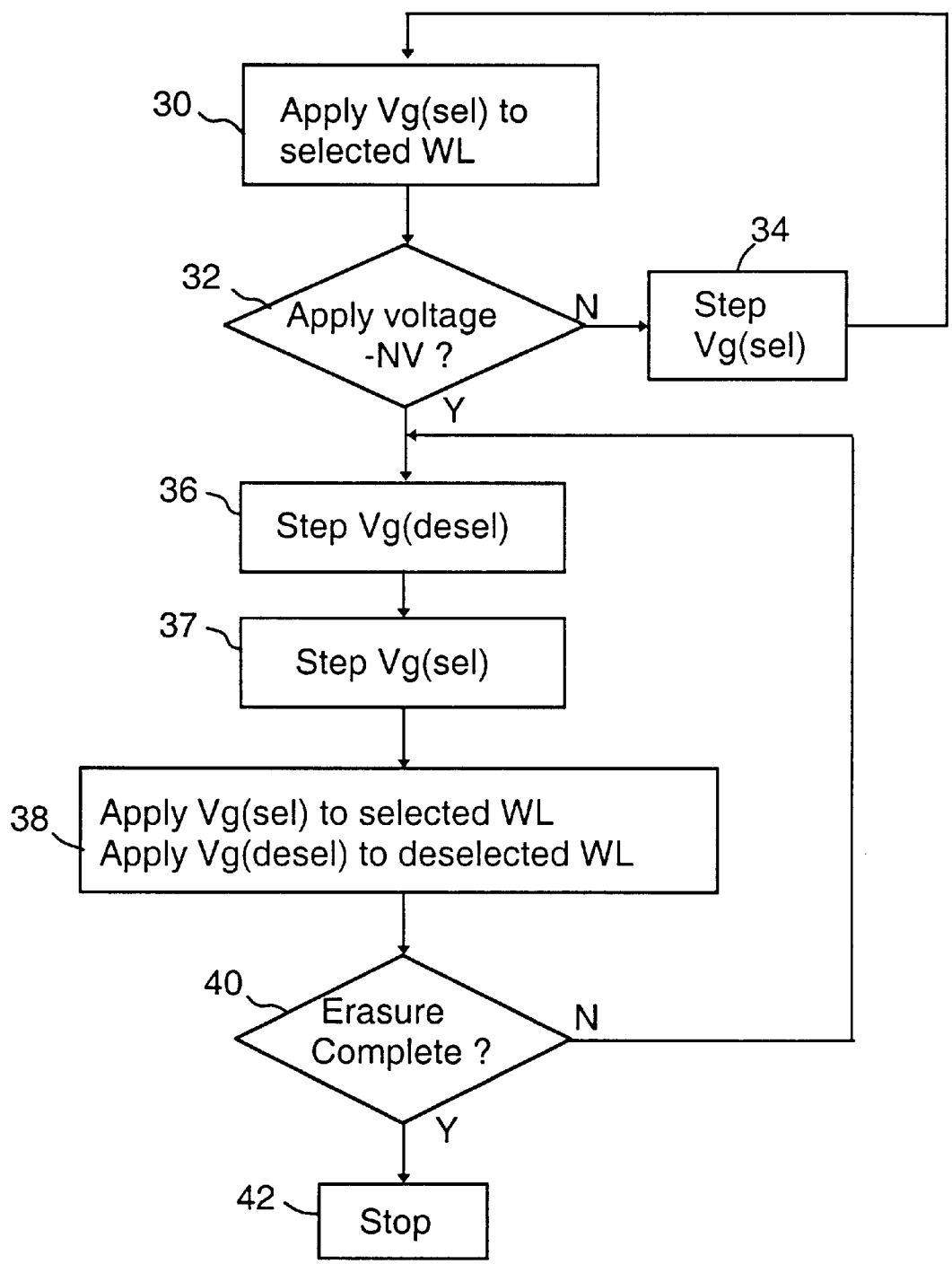
Figure 3C:
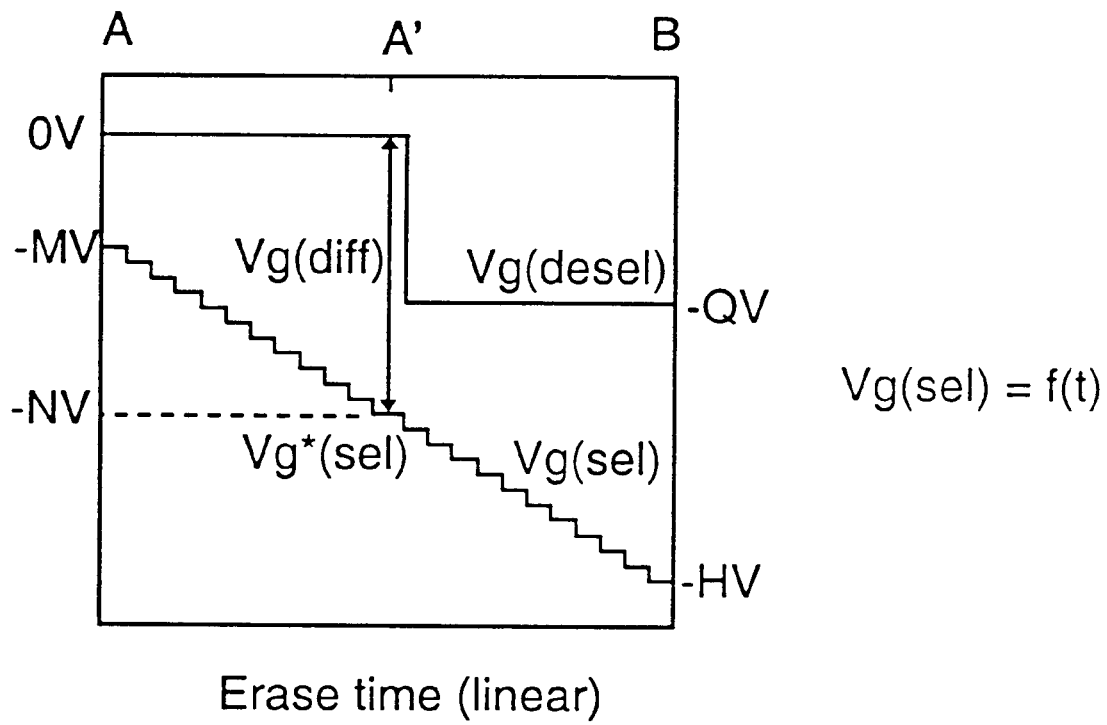

In one embodiment depicted in FIGS. 3A–C, the flash transistors are always cycled through the same erase procedure. This procedure is a function of time. The voltages are consistently applied to the selected wordlines and the deselected wordlines. Examples of these voltages are: –MV=–5 V, –HV=–12 V and QV=–2 V; or –MV=–7 V, –HV=–14 V and –QV=–4 V.

FIG. 3B is a flowchart showing the steps performed by the flash memory in order to apply the selected voltages to the wordlines. In step 30, the procedure begins by applying Vg(sel) to the selected wordline. At initialization, Vg(sel)=–MV. This application is sustained for a period of time, for example 10 ms. In step 32, the procedure determines whether the voltage Vg(sel) has reached –NV. If not, step 34 is performed to stepwise reduce the Vg(sel) voltage one increment, for example 0.2 V. Then, step 30 is performed again to apply the reduced Vg(sel) voltage to the selected wordline. If step 32 indicates that the voltage Vg(sel) has reached –NV, then step 36 stepwise reduces the Vg(desel) voltage one increment and step 37 stepwise reduces the Vg(sel) voltage one increment. Step 38 then applies the Vg(sel) voltage to the selected wordline and the Vg(desel) voltage to the deselected wordline. Step 40 determines whether the erase procedure is complete. If not, the procedure is returned to step 36 to further stepwise reduce the Vg(sel) voltage and Vg(desel) voltage. Step 36 will stop reducing the Vg(sel) voltage and Vg(desel) voltage once Vg(sel) reaches –HV and Vg(desel) reaches –QV. At that point, step 36 maintains the voltages at those settings and passed the processing to step 38 until step 40 determines that the erasure is complete. Once step 40 determines that the erasure is complete, step 42 ends the erase procedure.

FIG. 3C depicts an alternate aspect for applying Vg(desel) to the deselected wordlines. Instead of applying a stepwise decreasing voltage, a large step in the deselected wordline voltage Vg(desel) is taken to –QV when Vg(sel) reaches –NV. –QV is about 2 V higher than –NV to insure proper operation of the X-decoder, since 2 V is about the sum of the PMOS Vtp and NMOS Vtn for safety inverter operation. The large step in Vg(desel) prevents Vg(diff) from exceeding the breakdown voltage similarly to that depicted in FIG. 3A.

(b) Automatically Adjusting Erase Procedure (Voltage Based)

Figure 4A:
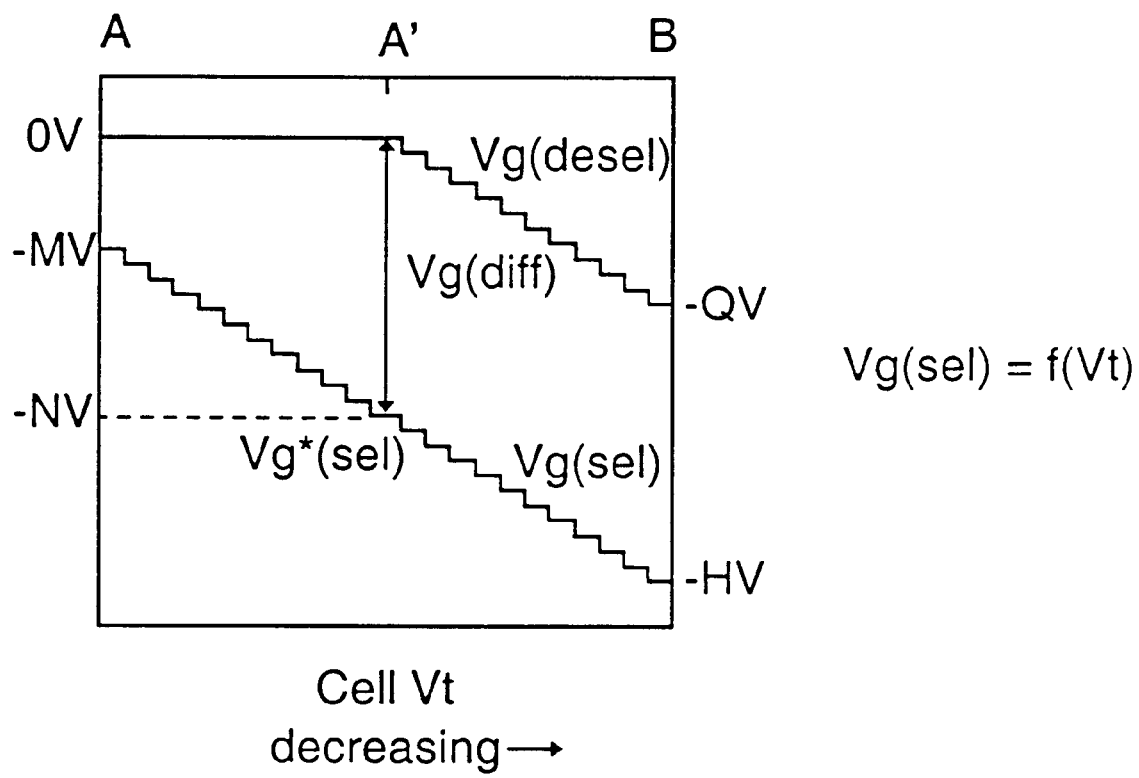
FIGS. 4A–C depict wordline voltages applied according to an embodiment of the invention that employs an automatically adjusting voltage.
Figure 4B:
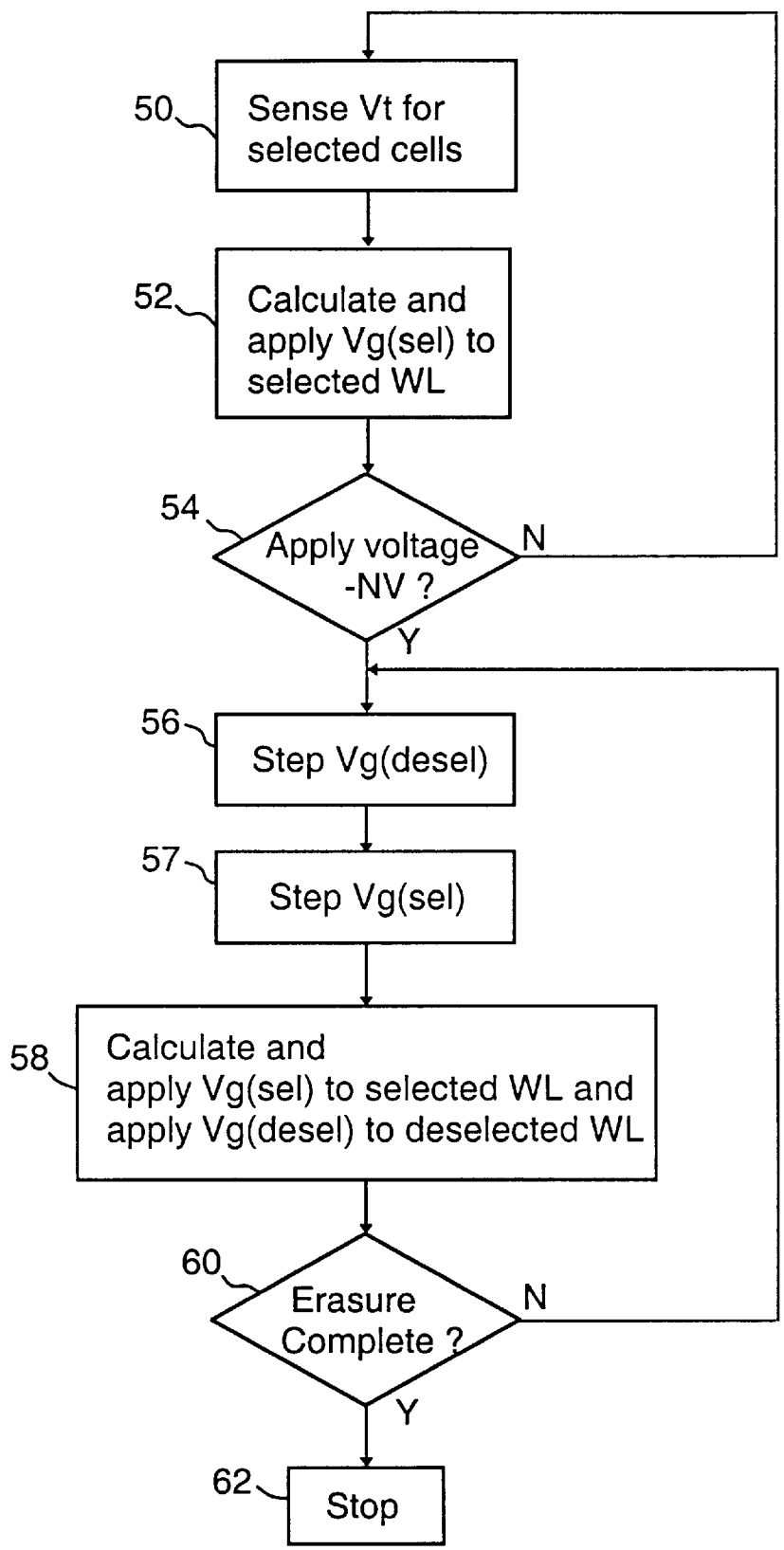
Figure 4C:
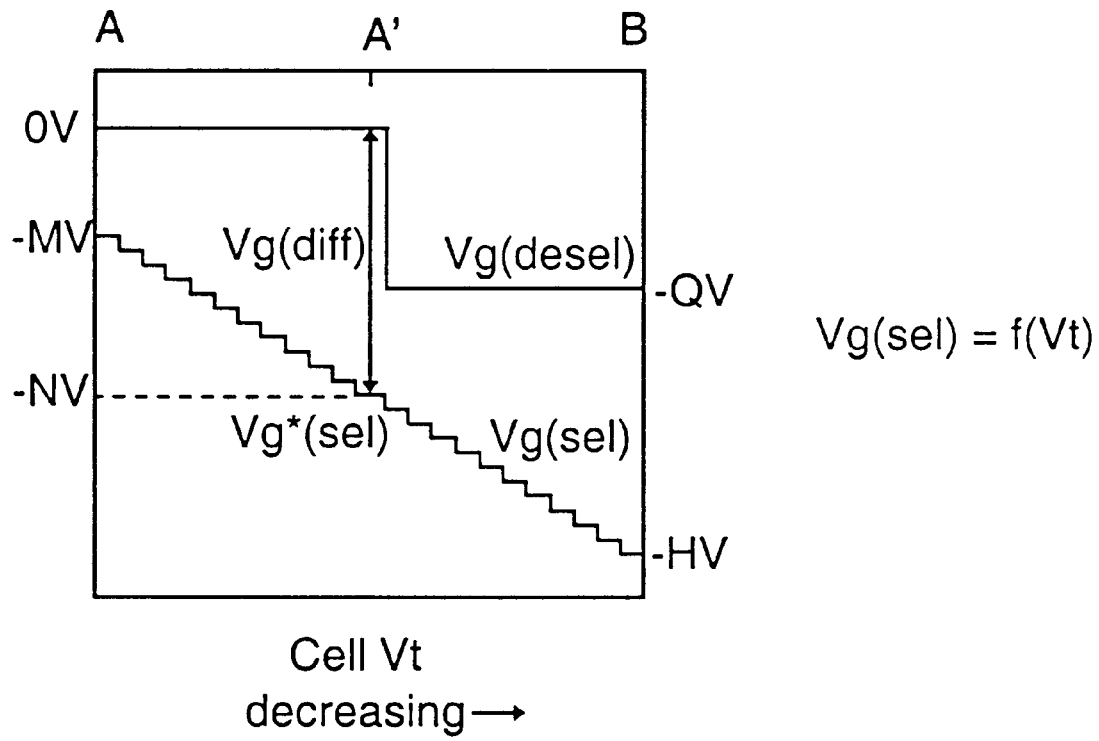

In another embodiment depicted in FIGS. 4A–C, the erase procedure senses the threshold of the flash transistors before erase and during erase verification. This technique uses the automatically adjustable voltage controller 17 shown in FIG. 2. The principal reason for the voltage based erase procedure is because threshold voltage Vt variations in flash transistors during manufacturing and over time cause the transistors to behave differently. For example, aged flash transistors typically take slightly longer to erase. In this embodiment, the voltages for –MV, –NV, –QV and –HV are similar to those of the prior embodiment, but can also be modified if desired. The principal modification to this embodiment is that the flash transistor threshold voltage is iteratively sensed and so the voltages Vg(sel) and Vg(desel) are provided on demand based on the calculations performed by the controller 17.

U.S. Ser. No. 08/779,765 filed Jan. 7, 1997 describes a technique for sensing the threshold voltage of the flash transistors prior to and at selected times during the erase procedure. A benefit of this technique is that the maximum electrical field in all cells is kept constant during the entire erase procedure. In the other words, Vg(sel) is a function of Vt, as shown in FIGS. 4A–B. With the algorithm described below with reference to FIG. 4B, during erasing operation, the maximum erased cell's Vt is checked periodically, and then the bias condition is updated in accordance with the cell's Vt. This approach provides an optimal control of the erasing operation, suppressing the spread of the cell's Vt distribution, and is accommodating to technology and process variations.

FIG. 4B is a flowchart showing the steps performed by the flash memory in order to perform the voltage based erasure. In this embodiment, the selected cells' maximum threshold voltage is verified periodically, and then changing voltages are applied in accordance with the changing of the threshold voltage. In step 50, the procedure senses the maximum threshold voltage (Vt) of the flash transistors to be erased. This is performed by stepwise increasing (or decreasing) the wordline voltage until the cells' channels are turned on (or off). The sense amplifier 14 senses the current and outputs a signal VT to the automatically adjusting voltage controller 17. In the case where multiple wordlines are selected, the sensing procedure is applied for all the selected wordlines. At step 52, the automatically adjustable voltage controller 17 calculates the target voltage to be applied to the selected wordline or wordlines Vg(sel) in order to efficiently erase the cells. In some cases Vg(sel) will begin at –MV, and in other cases Vg(sel) will be set below –MV. The target voltage is then communicated to the voltage regulator 16. The regulator controls the output of the pump circuit 15 to generate the target voltages. To increase the accuracy of the applied voltages, the gate voltage Vg, drain voltage Vd and source voltage Vs are directly fed back from the selected cells to be compared to the target voltages. To generate many of the different voltages needed for different procedures, the automatically adjusting voltage controller 17 is controls be the state machine 19. The state machine also controls the timing control 18 to control erase pulse width of the voltage generated by the voltage regulator 16. In step 54, the procedure determines whether the voltage Vg(sel) has reached –NV. If not, step 50 is again performed to calculate the Vg(sel) voltage and step 52 applies that voltage. If step 54 determines that Vg(sel) has reached –NV, then step 56 stepwise reduces the Vg(desel) voltage one increment and step 57 stepwise reduces the Vg(sel) voltage one increment. Step 58 then calculates and applies the Vg(desel) voltage to the deselected wordlines and the Vg(sel) voltage to the selected wordline or wordlines similar to that described in step 50. Step 60 determines whether the erase procedure is complete. If not, the procedure is returned to step 56 to further stepwise reduce the Vg(sel) voltage and Vg(desel) voltage. Once Vg(sel) reaches –HV and Vg(desel) reaches –MV step 56 maintains the voltages at those settings and passes the processing to step 58 until step 60 determines that the erasure is complete. Once step 60 determines that the erasure is complete, step 62 ends the erase procedure.

FIG. 4C depicts an alternate aspect for applying Vg(desel) to the deselected wordlines. Instead of applying a stepwise decreasing voltage, a large step in the deselected wordline voltage Vg(desel) is taken to –QV when Vg(sel) reaches –NV. –QV is about 2 V higher than –NV to insure proper operation of the X-decoder, since 2 V is about the sum of the PMOS Vtp and NMOS Vtn for safety inverter operation. The large step in Vg(desel) prevents Vg(diff) from exceeding the breakdown voltage similarly to that depicted in FIG. 4A.

(c) Sourceline Voltage

A further technique for increasing the erase speed includes increasing the selected sourceline voltage to increase the maximum electric field in the flash transistors selected for erasure. A structure that provides control over the sourceline to selected flash transistors is described in U.S. Ser. No. 08/872,475. Such a structure can be controlled simultaneously with the X-decoder to apply operational voltages to the selected wordlines and selected sourcelines. To quicken the erase procedure, the invention applies a sourceline voltage greater than the conventional voltage of 5 V. Unlike wordline voltage increases that gain only about 50% of the electrical field increase per volt increase, a sourceline voltage increase yields a 100% increase in the tunnel field per volt increase, thus increasing the erase current and speed by ten fold increase per volt increase. The maximum allowed sourceline voltage is limited by the BVDSS of the sourceline decoder. This sourceline voltage is about 10 V for a typical flash memory. Although a sourceline voltage increase quickens the erase procedure, a drawback is a resultant exponential increase in the substrate current between the P-N junction of the N+ source node and P substrate. In conventional flash memories, the erase size is typically a block of 64K or 128K bytes. Conventional memories do not have a technique for providing sourceline voltage to a limited number of cells. Since the erase size is relatively large, a sourceline voltage (for EPROM-type flash) or bitline voltage (for EEPROM-type flash) is not recommended over +5 V when the wordline is coupled to –10 V. The reason is to avoid causing too much substrate current and overloading the on-chip voltage pump. By contrast, U.S. Ser. No. 08/872,475 describes a technique to provide sourceline voltage to a specific number of cells. This novel technique provides a new array architecture that permits a small erase size and provides that the percentage of slow-erase-speed cells and trapping cells is low (most likely only a few bytes). Thus, in order to quickly erase the few slow-erase-speed cells and high-hole-trapping cells, increasing the sourceline or bitline voltage beyond +5 V is a highly effective technique.

Figure 5A:
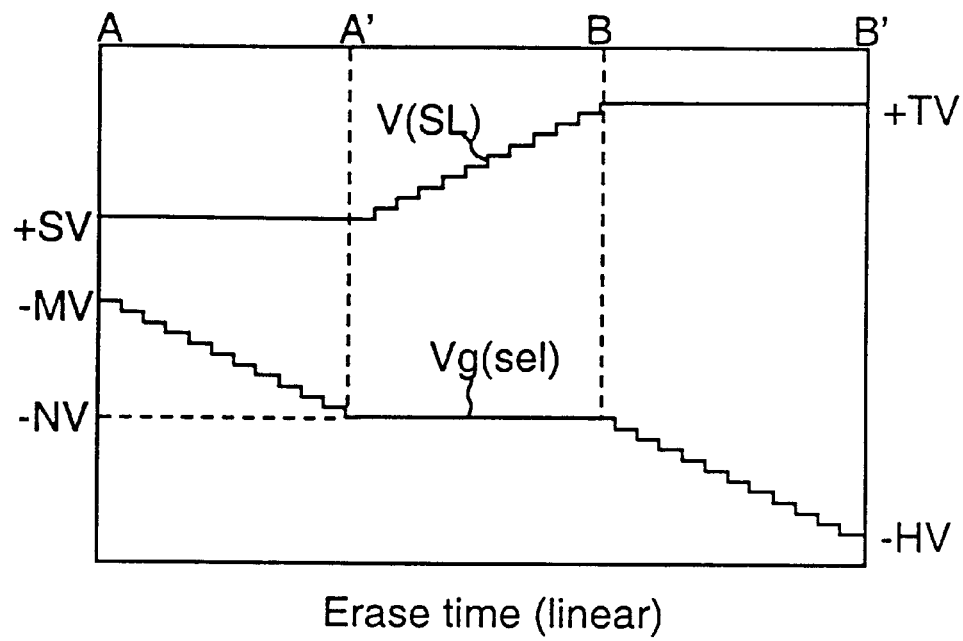
FIG. 5A–C depict selected wordline voltages and selected sourceline voltages applied according to embodiments of the invention.
Figure 5B:
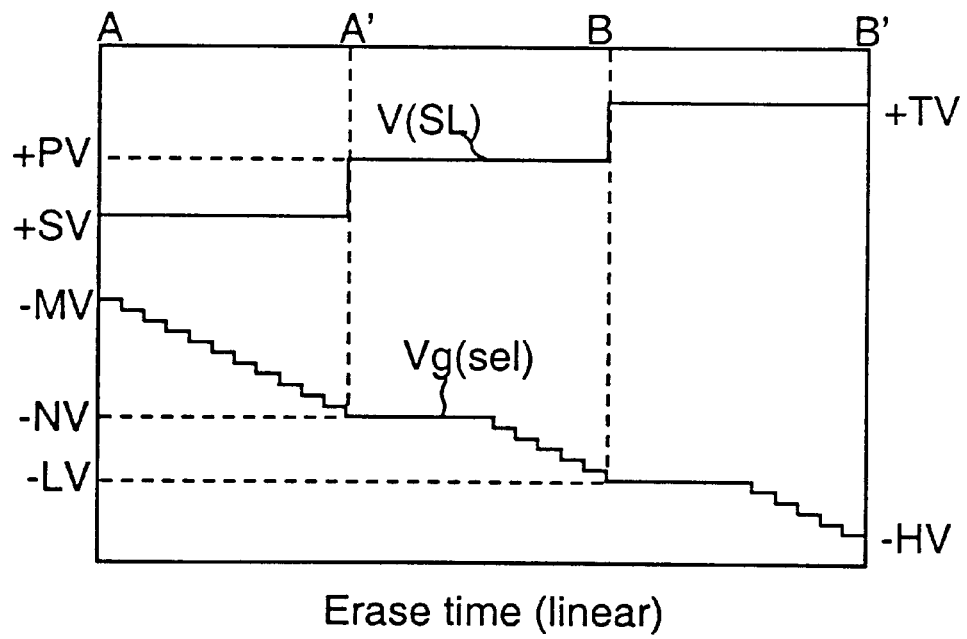
Figure 5C:
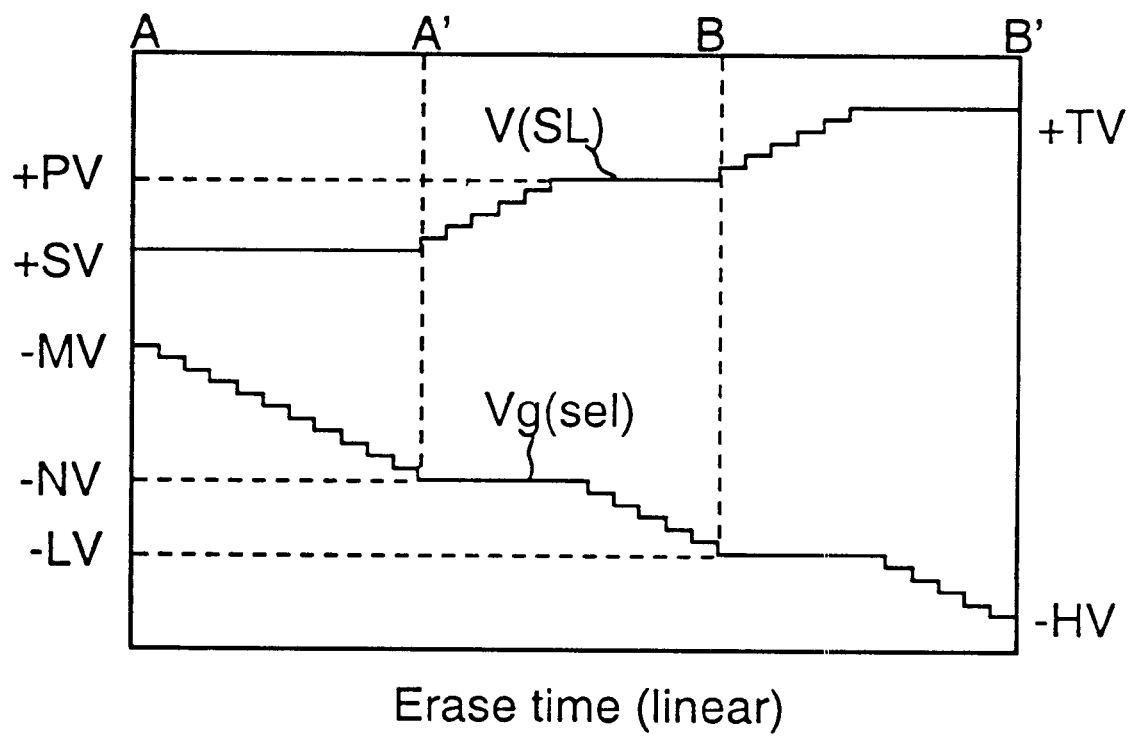

The embodiments described with reference to FIGS. 5A–C are intended to be combined with those of FIGS. 3A–C and 4A–C to reduce the erase time. FIG. 5A depicts exemplary voltages applied to selected flash memory wordlines and sourcelines according to an embodiment of the invention. The voltage for the selected wordline Vg(sel) is ramped in region A–A' from an initial voltage –MV to a voltage –NV. The voltage for the selected sourceline V(SL) is then ramped in the region A'–B from an initial voltage of +SV to a voltage +TV. This voltage is delivered to the array 11 via the X-decoder 12 or Y-decoder 13. Then the voltage for the selected wordline Vg(sel) is further ramped in the region B–B' from voltage –NV to voltage –HV. The voltage ramp function for V(SL) and Vg(sel) is performed by the timing control 18 and state machine 19.

FIG. 5B depicts an alternate aspect for applying V(SL) to the selected sourceline. Instead of applying a stepwise increasing voltage as in FIG. 5A, larger steps in the selected sourceline voltage V(SL) are taken to increase the voltage. At point A' V(SL) is increased from +SV to +PV. Then at point B V(SL) is increased from +PV to +TV. In this aspect of the invention, for example, +SV=5 V, +PV=6 V and +TV=7 V. Additional steps can also be employed if desired.

FIG. 5C depicts another alternate aspect for applying V(SL) to the selected sourceline. At point A' V(SL) is stepwise increased from +SV to +PV. Then at point B V(SL) is stepwise increased from +PV to +TV. In this aspect of the invention, for example, +SV=5 V, +PV=6 V and +TV=7 V. Additional steps can also be employed if desired.

In summary, there are two methods to increase the erase speed. One is to increase the wordline voltage to either greater positive voltage (>+15 V) for EEPROM-type flash or greater negative voltage (<−10 V) with respect to a non-ground level beyond the traditional device breakdown limitation of +/−10 V with respect to ground. The second is to increase the voltage of the sourceline for an EPROM-type flash memory or bitline for an EEPROM-type flash memory beyond +5 V to the highest limit of breakdown in order to shorten the erase time.

(d) Endurance Enhancement

As mentioned above, oxide degradation occurring in conventional erasing procedures has been observed to significantly reduce flash memory endurance. After many erase/program cycles, erasing efficiency is decreased due to the oxide degradation. As a result, it takes longer to erase aged cells than it does to erase new cells. In conventional flash memories, if the erase time takes longer than the specification allows, the erase will fail. Because conventional memories have predetermined fixed bias conditions, there is no way to change the condition after the cell's erasing efficiency is decreased. This problem has hindered the endurance of the prior art and limits the erase/program cycles in conventional flash memories to approximately 1M cycles.

In the invention with the automatically adjusting bias condition (FIGS. 4A–C), when the flash memory ages and the cell takes longer to erase, a more negative Vg(sel) or more positive sourceline or bitline voltage is applied earlier in the erase procedure to increase the erasing speed. Thus, the flash memory cells can be successfully erased within the specification time. Therefore, faster erase, higher endurance and longer life is realized.

C. Wordline Driver Circuit

Consider a N-channel transistor that has high voltage at drain, low voltage at the other electrodes gate, source and bulk. The channel must be off (that is why it is called gated), and all the Vdg (drain to gate), Vds (drain to source) and Vdb (drain to bulk) are high. Under this condition, the electrical field of the drain to bulk junction is significant. If the electrical field exceeds a specific value that the junction can afford, the junction breakdown occurs and a large current starts to flow from drain to bulk until the drain voltage is reduced. The gated breakdown voltage called BVDSS, which is approximately +/−10 V, depends on the technology, junction depth, impurity concentration and other factors. For a P-channel transistor, the gated breakdown condition is that, low voltage at drain, and high voltage at all the other three electrodes, gate, source and bulk. Similarly if all the Vdg, Vds and Vdb exceed a specific voltage, the junction breakdown occurs. In a thick oxide embodiment, the breakdown voltage is in excess of +/−10 V.

Figure 6A:
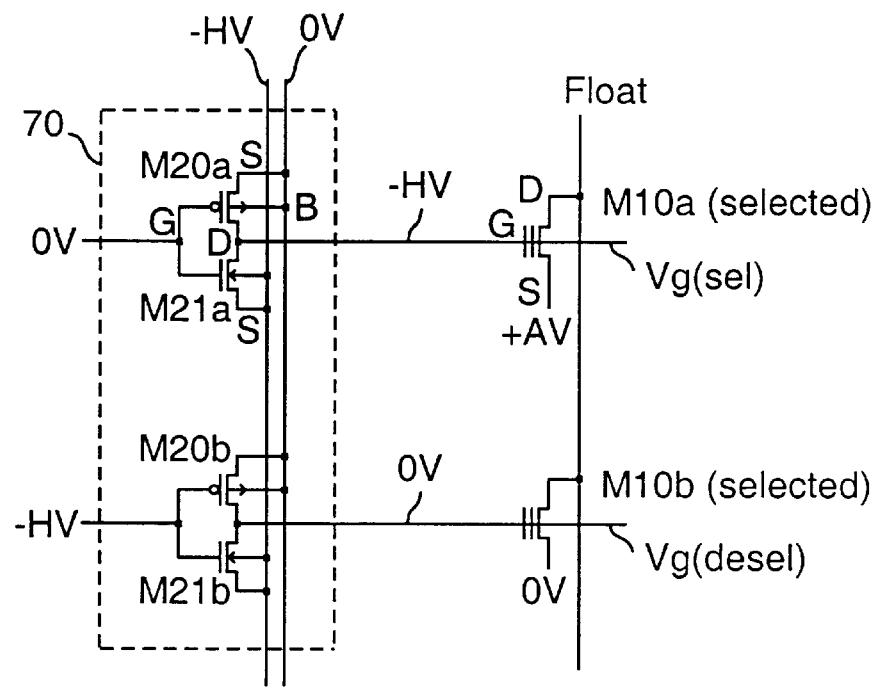
FIG. 6A depicts a wordline driver according to the prior art.
Figure 6B:
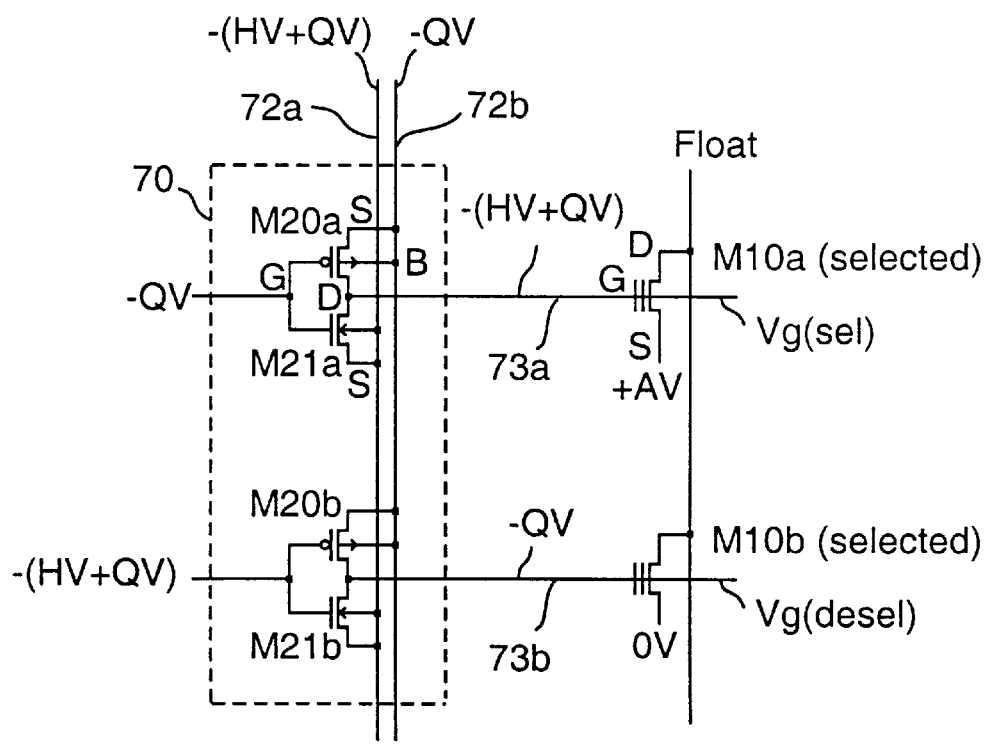
FIG. 6B depicts a wordline driver according to an embodiment of the invention.

FIG. 6A depicts a wordline driver according to the prior art. The gate of the selected cell M10$a$ is applied with −HV from transistor M21$a$ of the WL driver 70. The gate of the de-selected cell M10$b$ is applied with 0 V from transistor M20$b$ of the WL driver 70. Note that, the gate, source, drain and bulk of transistor M20$a$ is 0 V, 0 V, −HV and 0 V, respectively. The transistor is turned off and is below a known "gated junction breakdown," in which, if the drain-bulk voltage difference is higher than BVDSS (approximately +/−10 V) the drain-bulk junction will breakdown and cause large current leakage to the bulk until the voltage difference is reduced. This phenomena constrains the voltage of the Vg(sel). Similarly, transistor M21$b$ is off and is also under the same constraints.

FIG. 6B depicts a wordline driver according to an embodiment of the invention. By applying −MV, rather than 0 V, to the gate of de-selected cell M10$b$, the transistor M20$a$ is relaxed from the junction breakdown structure because the bulk is −MV now and the drain-bulk voltage difference is reduced. Therefore, the drain of the transistor can be lowered to −(HV+MV) and still keep the same drain-bulk voltage difference below BVDSS. As a result, more negative gate voltage is available for selected cells to increase the erasing speed.

In FIG. 6B, although the de-selected cell M10$b$ receives gate voltage −MV, it is not erased. Because the source of the cell is 0 V, not +MV, the electrical field is not high enough to create a tunneling current and erase the cell.

If the data of cells in the deselected wordlines has been disturbed, a post erase programming step may be needed to rescue the disturbed cells. The details of this post-erase programming method is described in U.S. Ser. No. 08/872,475.

Figure 1A:
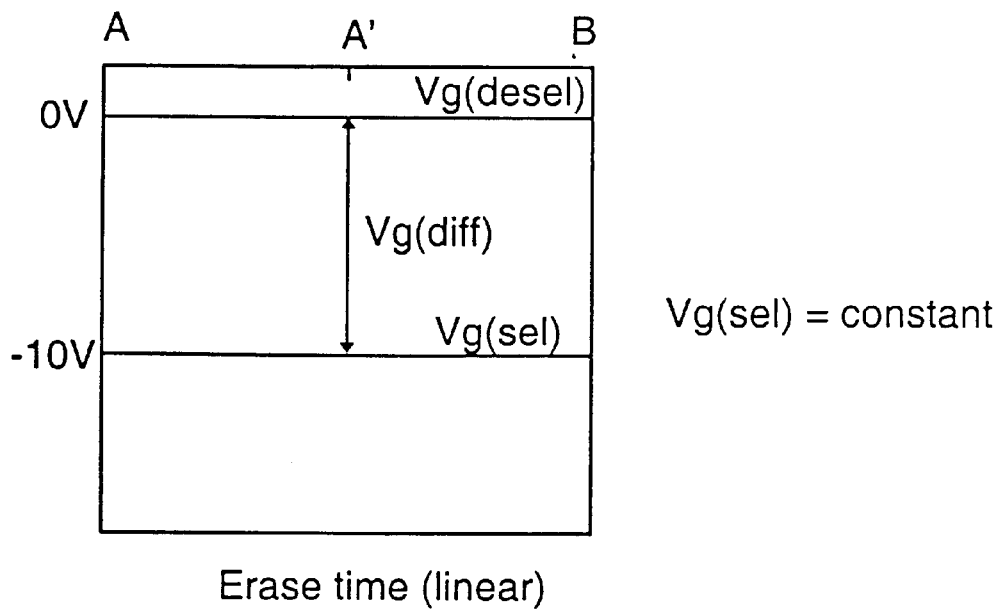
FIGS. 1A–B depict wordline voltages applied according to the prior art.
Figure 1B:
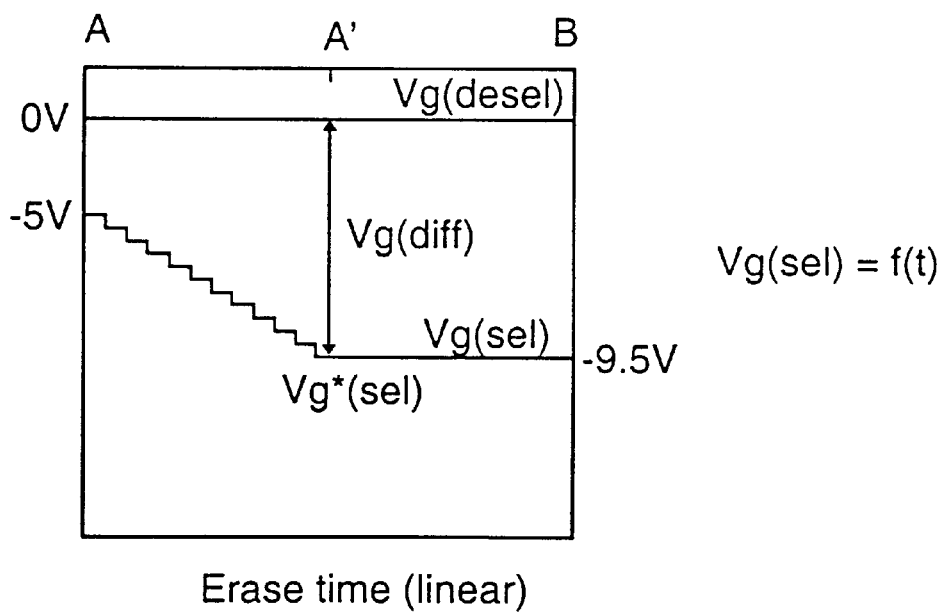

A second embodiment is described with reference to FIG. 6B, where the oxide thickness of the line drivers M20$a$, M21$a$, M20$b$ and M21$b$ is increased to provide a greater BVDSS (e.g. in excess of +/−10 V). Such a construction typically requires an extra step in the semiconductor manufacturing process because the memory transistors and some of the other wordline decoder transistors (e.g. address decoder) are still constructed using thin oxide semiconductor technology. In this embodiment, this extra step is worthwhile because it allows a higher voltage to be applied to the selected wordlines while maintaining the deselected wordlines at a lower voltage. That is, this embodiment allows a greater voltage differential between the selected and deselected wordlines compared to the prior embodiments. In the second embodiment, for example, a selected wordline can be applied with a high voltage in excess of +/−10 V while deselected wordlines can be maintained at VSS (0 V). A graph showing the applied voltage is similar to that of FIG. 1B, but where Vg(diff) is in excess of 10 V. Alternately, a selected wordline can be applied with a high voltage in excess of +/−10 V while deselected wordlines are applied with a lesser voltage than the prior embodiments (because BVDSS is higher for the thick oxide wordline driver). This lesser voltage reduces the possibility of disturbing the data on the deselected wordlines. A graph showing the applied voltage is similar to that of FIG. 3A, but where Vg(diff) is in excess of 10 V.

D. Examples

A comparison for the easing speed of the conventional art and that of the invention is explained with the following example. The cell's initial threshold voltage (Vt) is assumed to be 6 V.

(a) First Conventional Art

| (a) First Conventional Art | | |
|---|---|---|
| Vg(sel) | Vt | Time |
| −10 V | 6 V to 5 V | 100 us (exponential) (most severe oxide degrade) |
| −10 V | 5 V to 4 V | 1 ms (exponential) (severe oxide degrade) |

-continued

| Vg(sel) | Vt | Time |
|---|---|---|
| −10 V | 4 V to 3 V | 10 ms (exponential) (negligible oxide degrade) |
| −10 V | 3 V to 2 V | 100 ms (exponential) (negligible oxide degrade) |
| −10 V | 2 V to 1 V | 1 s (exponential) (negligible oxide degrade) |
| | | Total time: approximately 1.1 sec. |

(b) Second Conventional Art

| Vg(sel) | Vt | Time |
|---|---|---|
| −6 V | 6 V to 5 V | 10 ms (linear) (negligible oxide degrade) |
| −8 V | 5 V to 4 V | 10 ms (linear) (negligible oxide degrade) |
| −10 V | 4 V to 3 V | 10 ms (linear) (negligible oxide degrade) |
| −10 V | 3 V to 2 V | 100 ms (exponential) (negligible oxide degrade) |
| −10 V | 2 V to 1 V | 1 s (exponential) (negligible oxide degrade) |
| | | Total time: approximately 1.1 sec. |

(c) The Invention

| Vg(sel) | Vt | Time |
|---|---|---|
| −6 V | 6 V to 5 V | 10 ms (linear) (negligible oxide degrade) |
| −8 V | 5 V to 4 V | 10 ms (linear) (negligible oxide degrade) |
| −10 V | 4 V to 3 V | 10 ms (linear) (negligible oxide degrade) |
| −12 V* | 3 V to 2 V | 10 ms (linear) (negligible oxide degrade) |
| −14 V* | 2 V to 1 V | 10 ms (linear) (negligible oxide degrade) |
| | | Total time: approximately 0.05 sec. |

*In this voltage range, the X-decoder driver operates at a greater BVDSS with respect to a negative voltage as opposed to the conventional BVDSS voltage of −10 V with respect to ground.

The first conventional art uses a constant selected wordline voltage Vg(sel) at −10 V. As the cell's Vt decreases, the tunneling electrical field decreases, which causes the erasing time to increase at an approximately exponential rate. This results in fast erasing in the beginning but tremendously slow erasing when the cell's Vt becomes low. Experiments have shown a drawback of the fast erasing in the beginning that causes oxide degradation and significantly reduces the cell endurance.

The second conventional art uses a stepwisely decreased Vg(sel) from about −6 V to −10 V (e.g. U.S. Pat. No. 5,485,423). By decreasing Vg(sel) along the decreasing of cell's Vt, the tunneling electrical field is kept approximately constant and the starting portion of the erasing time is linear. The high field in the beginning is avoided and the oxide degradation is improved. However, after Vg(sel) reaches the maximum negative value of −10 V, and it cannot decrease with the cell's Vt any more, the erasing time becomes exponential. As a result, this technique takes as long as the first conventional art to erase the cell to a low Vt in the 3 to 1 volt range.

The invention provides that the Vg(sel) can continue to be reduced, unlike the conventional art. The Vg(sel) can be further decreased along the decreasing of the cell's Vt since a negative voltage is also applied to the deselected wordlines Vg(desel). Therefore, for the selected cells, the tunneling electrical field is kept high and constant and a linear erasing time is obtained for the entire erase procedure. This technique significantly reduces the erasing time and avoids oxide degradation.

It is also worth noting that the methods to stepwise decrease Vg(sel) for the second conventional art and the invention are different. In the second conventional art, the decreasing of Vg(sel) is purely a function of time and there is no corresponding decrease of Vg(desel). In one aspect of the invention, the decreasing of Vg(sel) is a function of cell's Vt and the number of erasing pulses. Due to variation of the cell's characteristic, the erasing speed of each cell is different. Many cells are erased simultaneously. However, the conventional art does not take care of the variation in erasing speed of the cells. The erasing time of a fast cell can be one hundredth of that of a slow cell. It takes 10 ms to erase a fast cell from 4 V to 3 V, it may take 1 sec to erase a slow cell.

In one embodiment, the invention detects the slowest cells' Vt, and adjusts Vg(sel) according to the Vt. After a pre-determined number of pulses, if the cell's Vt is not lowered to a pre-determined value, the next Vg(sel) is applied. For example, if the slow cell can not be erased from 4 V to 3 V with ten pulses, which equals 100 ms, Vg(sel) is changed from −10 V to −12 V immediately. This increases the erasing speed by approximately 10 times. If the cell still can not be erased with ten pulses, Vg(sel) is decreased to −14 V, which increases the erasing speed by approximately 100 times of that of −10 V, thus the slow cell can be erased within ten pulses, equal to 100 ms. The total erasing time for the slow cell is 300 ms, which is much faster than the conventional art.

E. Program Procedure

Figure 7:
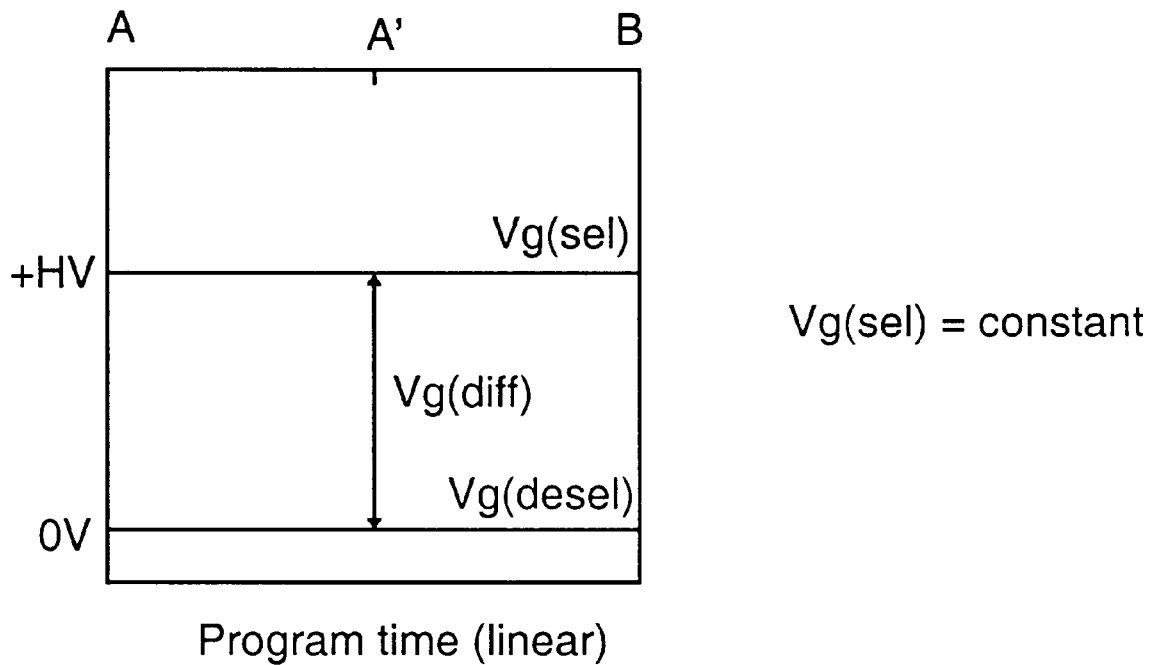
FIG. 7 depicts a wordline voltage applied according to the prior art.

While the erase procedure is described in detail above, the invention can also be employed to provide a fast program procedure. FIG. 7 depicts a wordline voltage applied according to the prior art. A fixed voltage of this type is similar to that described with reference to FIG. 1A.

Figure 8A:
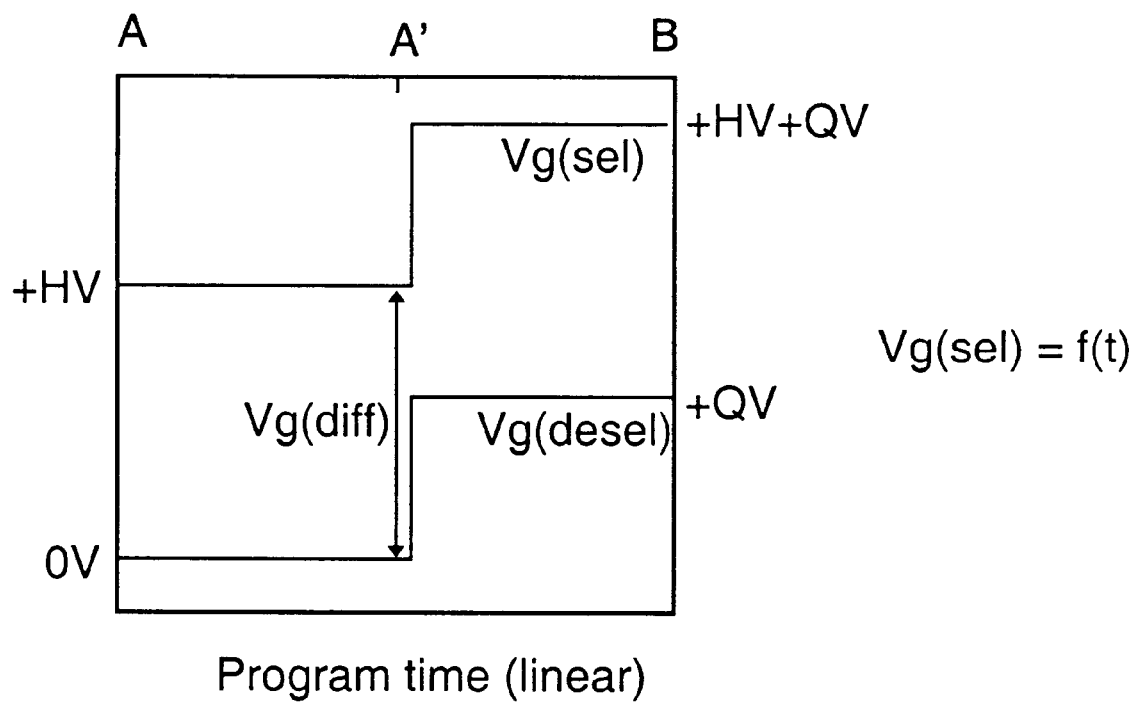
FIGS. 8A–C depict wordline voltages applied according to an embodiment of the invention.
Figure 8B:
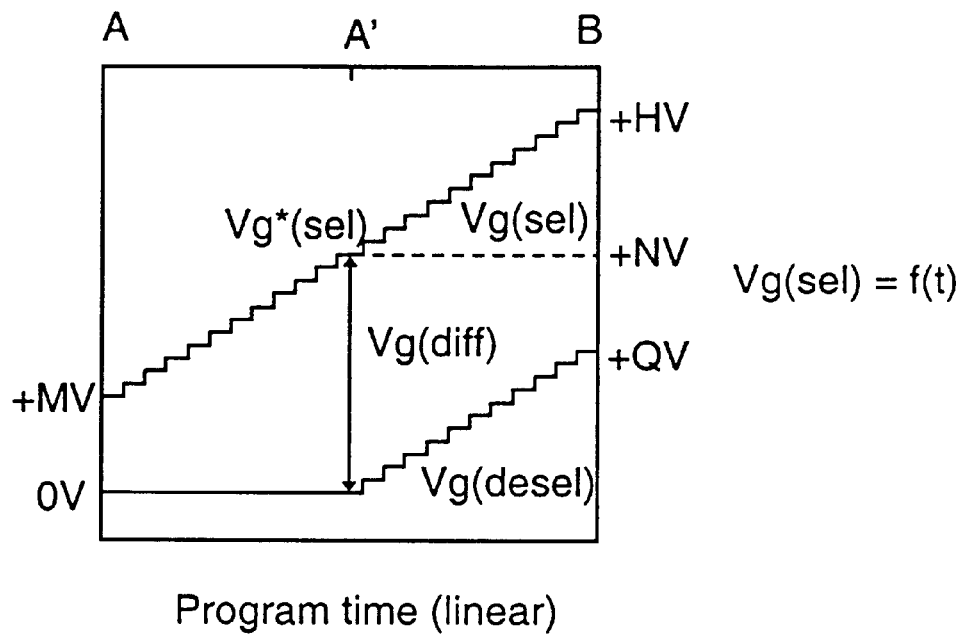
Figure 8C:
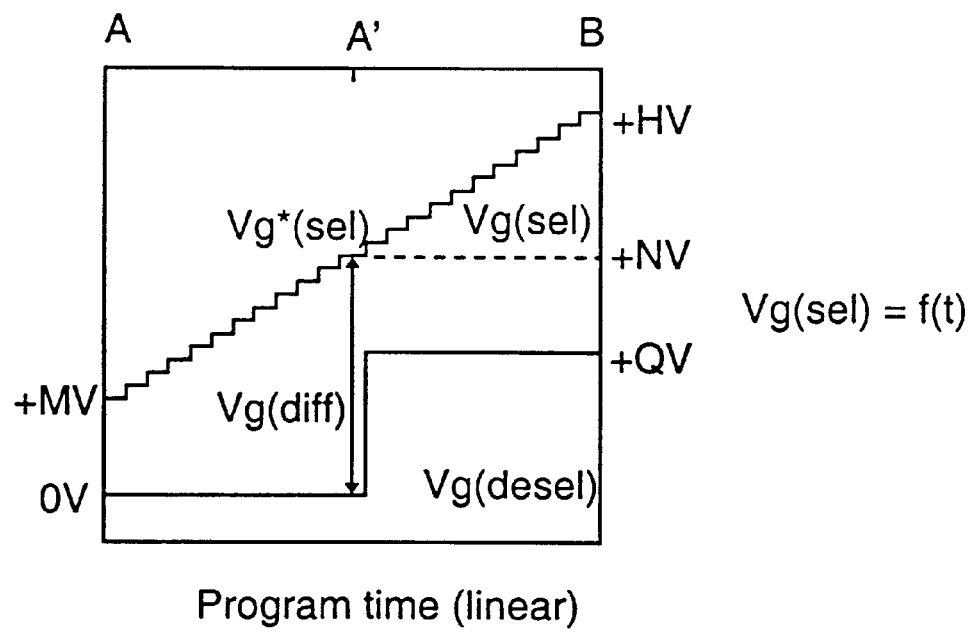

FIGS. 8A–C depict wordline voltages applied according to an embodiment of the invention that employs a time based program procedure similar to that described with reference to FIGS. 3A–C.

Figure 9A:
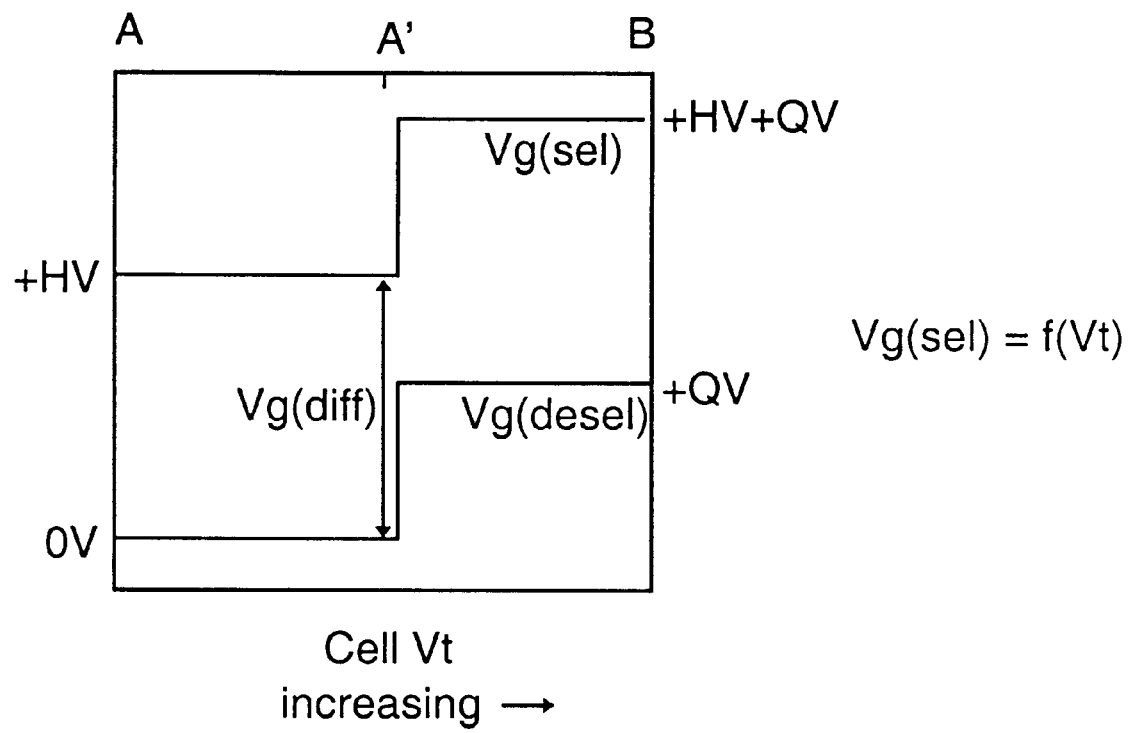
FIGS. 9A–C depict wordline voltages applied according to an embodiment of the invention that employs a automatically adjusting voltage.
Figure 9B:
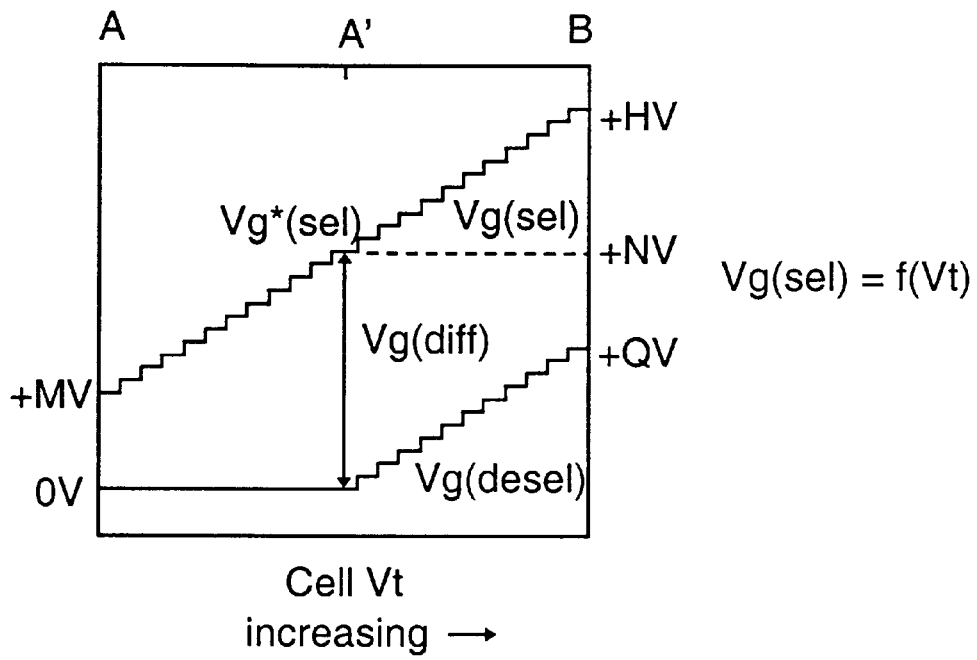
Figure 9C:
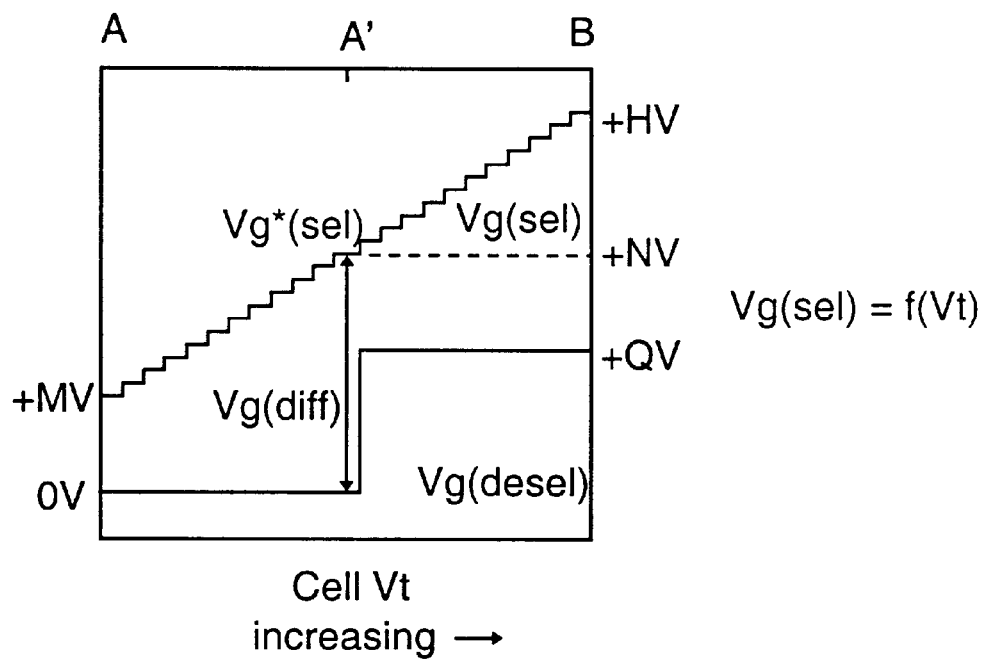

FIGS. 9A–C depict wordline voltages applied according to an embodiment of the invention that employs a automatically adjusting program procedure similar to that described with reference to FIGS. 4A–C. The voltage is controlled by controller 17.

Figure 10A:
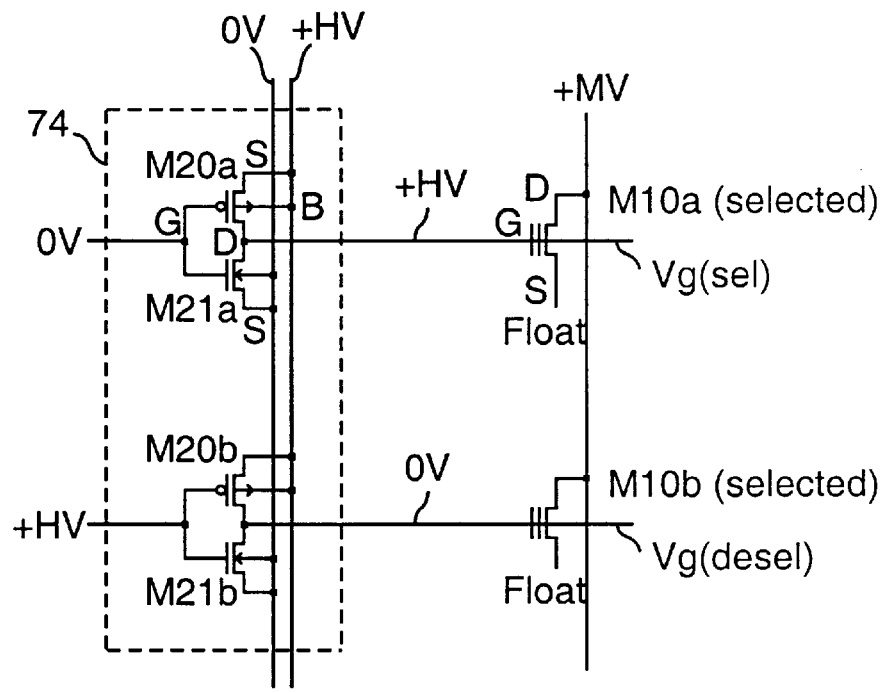
FIG. 10A depicts a wordline driver according to the prior art.

FIG. 10A depicts a wordline driver according to conventional art, similar to FIG. 6A. The voltage applied to the selected wordlines is similarly limited because the voltage difference between the drain-bulk junction is limited to BVDSS. This phenomena constrains the voltage of the Vg(sel).

Figure 10B:
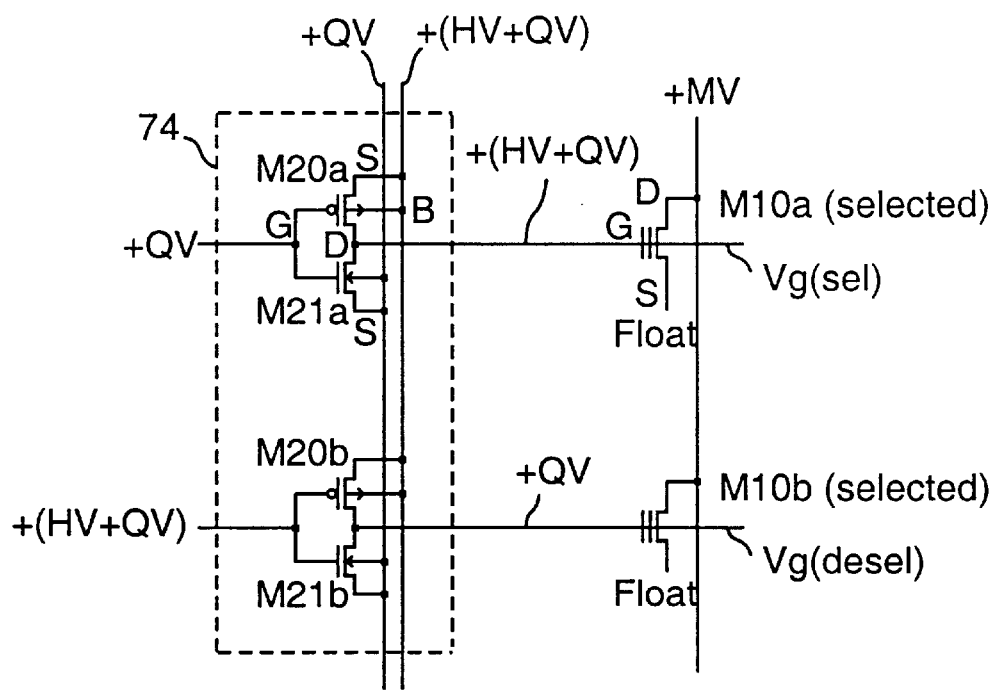
FIG. 10B depicts a wordline driver according to an embodiment of the invention.

FIG. 10B depicts a wordline driver according to an embodiment of the invention similar to FIG. 6B. By applying +MV, rather than 0 V, to the gate of deselected cell M10b, the transistor M20a is relaxed from the junction breakdown structure, because the bulk is +MV now and the drain-bulk voltage difference is reduced. Therefore, the drain of the transistor can be raised to +(HV+MV) and still keep the same drain-bulk voltage difference below BVDSS. As a result, more positive gate voltage is available for selected cells to increase the programming speed. This gate voltage increase method is mainly targeted to erase the EEPROM-type flash cells that defines the erase by application of a positive gate voltage as opposed to EPROM-type flash cells that defines the erase by application of a negative gate voltage.

Both of these embodiments provide a program function that improves program speed and reduces the Vg(diff) on the wordline drivers.

F. Voltage Pump Circuit

A voltage pump circuit 15 is coupled to a voltage regulator 16 for supplying a variety of voltages to the memory. Voltage pump circuits are known in the art and example is given by way of reference to U.S. Pat. Nos. 4,679,134 and 4,812,961. Additional types of pumps that can be incorporated in the invention are described in U.S. Ser. No. 08/744, 200 filed on Nov. 5, 1997 (Atty Docket No. A-63967/TOH/ MAK); U.S. Ser. No. 08/772,232 filed on Dec. 23, 1996 (Atty Docket No. A-64099/TOH/MAK); and U.S. Ser. No. 08/814,913 filed Mar. 11, 1997 (Atty Docket No. A-64245/ TOH/MAK). The incorporation of a pump generator with the exemplary embodiments expands the operational voltages in order to facilitate improved yield and operation of the memory.

For example, if the memory is supplied with VDD(+3.3 V), and needs other voltages such as +5 V, +7 V, +10, +12 (VPP), −10 V, −12 V, −14 V(VNN) and others, the voltage pump generator creates the needed voltage and provides it to the decoder circuits to accomplish the necessary function.

G. Conclusion

Advantages of the invention include a fast erasing procedure due to the increased voltage differential applied between the gate and source of flash transistors selected to be erased. Moreover, since the deselected wordlines are also ramped to either a negative or positive voltage along with the selected wordline voltage raised to a greater negative or positive voltage, stress is reduced on the wordline drivers, thereby increasing the longevity of the flash memory.

Having disclosed exemplary embodiments and the best mode, modifications and variations may be made to the disclosed embodiments while remaining within the scope of the invention as defined by the following claims.

What is claimed is:

1. A flash memory comprising:

a bank of flash transistors having a plurality of wordlines, a plurality of bitlines and a sourceline;

a wordline decoder having semiconductor devices devices coupled to said wordlines and configured to selectively apply voltages to said wordlines to perform procedures on said flash transistors, said procedures including a read procedure, an erase procedure and a program procedure;

wherein during said erase procedure, said wordline decoder is configured to apply a first increasingly negative selected voltage in a first voltage range to at least one selected wordline until a first applied voltage is met, and to apply a decreased deselected voltage decreasing said deselected voltage from one voltage to a more negative voltage to at least one deselected wordline in order to maintain a voltage difference between said selected voltage and said deselected voltage below a breakdown voltage.

2. The flash memory of claim 1, wherein:

said erase procedure is approximately linear.

3. The flash memory of claim 2, wherein:

during said erase procedure, said wordline decoder is configured to apply a first increasingly negative voltage in a first voltage range to at least one selected wordline until a first applied voltage is met, then to apply a second increasingly negative voltage in a second voltage range to said selected wordline and to apply said deselected voltage, which is a third negative voltage in a third voltage range to said at least one deselected wordline;

said second voltage range is substantially contiguous with said first voltage range; and said erase procedure is approximately linear.

4. The flash memory of claim 3, wherein:

said second voltage range is an adjustable voltage range beyond BVDSS, but wherein said wordline decoder maintains an internal voltage differential below BVDSS.

5. The flash memory of claim 3, wherein:

said flash memory is configured to detect a threshold voltage of at least one of said flash transistors;

said first voltage range is applied to said selected wordline when said threshold voltage is above a predetermined threshold voltage; and said second voltage range is applied to said selected wordline when said threshold voltage is below said predetermined threshold voltage.

6. The flash memory of claim 3, further comprising:

a sourceline decoder coupled to said sourceline and configured to selectively apply voltage to said sourceline to perform procedures on said flash transistors, said procedures including a read procedure, an erase procedure and a program procedure;

wherein during said erase procedure, said sourceline decoder is configured to apply a positive voltage; and wherein said sourceline decoder is configured to apply said positive voltage prior to said wordline decoder applying said second increasingly negative voltage in said second voltage range.

7. The flash memory of claim 3, wherein:

a bitline decoder coupled to said bitlines and configured to selectively apply voltages to selected bitlines to perform procedures on said flash transistors, said procedures including a read procedure, an erase procedure and a program procedure;

wherein during said erase procedure, said bitline decoder is configured to apply a positive voltage; and said bitline decoder is configured to apply said positive voltage prior to said wordline decoder applying said second increasingly negative voltage in said second voltage range.

8. The flash memory of claim 1, further comprising:

a sourceline decoder coupled to said sourceline and configured to selectively apply voltage to said sourceline to perform procedures on said flash transistors, said procedures including a read procedure, an erase procedure and a program procedure;

wherein during said erase procedure, said sourceline decoder is configured to apply a positive voltage.

9. The flash memory of claim 8, wherein:

during said erase procedure, said sourceline decoder is configured to apply an increasingly positive voltage.

10. The flash memory of claim 1, wherein: said first voltage range is an adjustable voltage range beyond +/−10 V.

11. The flash memory of claim 1, further comprising:

a bitline decoder coupled to said bitlines and configured to selectively apply voltages to selected bitlines to perform procedures on said flash transistors, said procedures including a read procedure, an erase procedure and a program procedure; and wherein during said erase procedure, said bitline decoder is configured to apply a positive voltage.

12. The flash memory of claim 11, wherein:

during said erase procedure, said bitline decoder is configured to apply an increasingly positive voltage.

13. The flash memory of claim 1, wherein:

said flash memory is configured to detect a threshold voltage of at least one of said flash transistors; and said first voltage range is applied to said selected wordline during a first time based on said threshold voltage.

14. A flash memory comprising:

a bank of flash transistors having a plurality of wordlines, a plurality of bitlines and a sourceline;

a wordline decoder having semiconductor devices coupled to said wordlines and configured to selectively apply voltages to said wordlines to perform procedures on said flash transistors, said procedures including a read procedure, an erase procedure and a program procedure;

wherein during said program procedure, said wordline decoder is configured to apply a first increasingly positive selected voltage in a first voltage range to at least one selected wordline until a first applied voltage is met, and to apply an increased deselected voltage increasing said deselected voltage from one voltage to a more positive voltage to at least one deselected wordline in order to maintain a voltage difference between said selected voltage and said deselected voltage below a breakdown voltage.

15. The flash memory of claim 14, wherein:

during said program procedure, said wordline decoder is configured to apply a first increasingly positive voltage in a first voltage range to at least one selected wordline until a first applied voltage is met, then to apply a second increasingly positive voltage in a second voltage range to said selected wordline and to apply said deselected voltage, which is a third positive voltage in a third voltage range to at least one deselected wordline;

said second voltage range is substantially contiguous with said first voltage range; and said program procedure is approximately linear.

16. The flash memory of claim 15, wherein:

said flash memory is configured to detect a threshold voltage of at least one of said flash transistors;

said first voltage range is applied to said selected wordline while said threshold voltage is below a predetermined threshold voltage; and said second voltage range is applied to said selected wordline while said threshold voltage is above said predetermined threshold voltage.

17. The flash memory of claim 14, wherein:

said flash memory is configured to detect a threshold voltage of at least one of said flash transistors; and said first voltage range is applied to said selected wordline during a first time based on said threshold voltage.

18. The flash memory of claim 14, wherein:

said first voltage range is an adjustable voltage range beyond +/−10 V.

19. The flash memory of claim 14, further comprising:

a sourceline decoder coupled to said sourceline and configured to selectively apply voltage to said sourceline to perform procedures on said flash transistors, said procedures including a read procedure, an erase procedure and a program procedure;

wherein during said program procedure, said sourceline decoder is configured to apply a positive voltage.

20. The flash memory of claim 14, further comprising:

a bitline decoder coupled to said bitlines and configured to selectively apply voltages to selected bitlines to perform procedures on said flash transistors, said procedures including a read procedure, an erase procedure and a program procedure;

wherein during said program procedure, said bitline decoder is configured to apply a positive voltage.

21. A method of performing an erase procedure in a flash memory having a bank of flash transistors with a plurality of wordlines, a plurality of bitlines and a sourceline, using a wordline decoder having semiconductor devices, comprising the steps of:

applying a first increasingly negative selected voltage in a first voltage range to at least one selected wordline until a first applied voltage is met;

applying a decreased deselected voltage decreasing said deselected voltage from one voltage to a more negative voltage to at least one deselected wordline; and maintaining a voltage difference between said selected voltage and said deselected voltage below a breakdown voltage.

22. The method of claim 21, wherein:

said erase procedure is approximately linear.

23. The method of claim 21, further comprising the step of:

applying a second increasingly negative voltage in a second voltage range to said selected wordline and applying said deselected voltage, which is a third negative voltage in a third voltage range; and wherein said second voltage range is substantially contiguous with said first voltage range; and wherein said erase procedure is approximately linear.

24. The method of claim 23, further comprising the step of:

detecting a threshold voltage of at least one of said flash transistors; and wherein said first voltage range is applied to said selected wordline when said threshold voltage is above a predetermined threshold voltage; and wherein said second voltage range is applied to said selected wordline when said threshold voltage is below said predetermined threshold voltage.

25. The method of claim 23, wherein:

said second voltage range is an adjustable voltage range beyond BVDSS.

26. The method memory of claim 23, further comprising the step of:

selectively applying to a selected sourceline a positive voltage prior to applying said second increasingly negative voltage.

27. The method memory of claim 23, further comprising the step of:

selectively applying to a selected bitline a positive voltage prior to applying said second increasingly negative voltage.

28. The method memory of claim 21, further comprising the step of:

selectively applying to a selected sourceline a positive voltage.

29. The method memory of claim 21, further comprising the step of:

selectively applying to a selected sourceline an increasingly positive voltage.

30. The method of claim 21, wherein:

said second voltage range is an adjustable voltage range beyond +/−10 V.

31. The method memory of claim 21, further comprising the step of:

selectively applying to at least one selected bitline a positive voltage.

32. The method memory of claim 21, further comprising the step of:

selectively applying to a selected bitline an increasingly positive voltage.

33. The method of claim 21, further comprising the step of:

detecting a threshold voltage of at least one of said flash transistors; and wherein said first voltage range is applied to said selected wordline during a first time based on said threshold voltage.

34. A method of performing a program procedure in a flash memory having a bank of flash transistors with a plurality of wordlines, a plurality of bitlines and a sourceline, using a wordline decoder having semiconductor devices, comprising the steps of:

applying a first increasingly positive selected voltage in a first voltage range to at least one selected wordline until a first applied voltage is met;

applying an increased deselected wordline voltage increasing said deselected voltage from one voltage to a more positive voltage to at least one deselected wordline; and maintaining a voltage difference between said selected voltage and said deselected voltage below a breakdown voltage.

35. The method of claim 34, further comprising the step of:

applying a second increasingly positive voltage in a second voltage range to said selected wordline and applying said deselected voltage, which is a third negative voltage in a third voltage range; and wherein said second voltage range is substantially contiguous with said first voltage range; and wherein said program procedure is approximately linear.

36. The method of claim 35, wherein:

said second voltage range is an adjustable voltage range beyond +/−10 V.

37. The method of claim 35, further comprising the step of:

detecting a threshold voltage of at least one of said flash transistors; and wherein said first voltage range is applied to said selected wordline while said threshold voltage is below a predetermined threshold voltage; and wherein said second voltage range is applied to said selected wordline while said threshold voltage is above said predetermined threshold voltage.

38. The method of claim 34, further comprising the step of:

detecting a threshold voltage of at least one of said flash transistors; and wherein said first voltage range is applied to said selected wordline during a first time based on said threshold voltage.

39. The method memory of claim 34, further comprising the step of:

selectively applying to a selected sourceline a negative voltage.

40. The method memory of claim 34, further comprising the step of:

selectively applying to at least one selected bitline a negative voltage.

41. A flash memory comprising:

a bank of flash transistors having a plurality of wordlines, a plurality of bitlines and a sourceline;

a wordline decoder having semiconductor devices coupled to said wordlines and configured to selectively apply voltages to said wordlines to perform procedures on said flash transistors, said procedures including a read procedure, an erase procedure and a program procedure;

wherein said wordline decoder executes one of said erase procedure and said program procedure:

wherein during said erase procedure, said wordline decoder is configured to apply a first increasingly negative selected voltage in a first voltage range to at least one selected wordline until a first applied voltage is met, and to apply a decreased deselected voltage decreasing said deselected voltage from one voltage to a more negative voltage to at least one deselected wordline in order to maintain a voltage difference between said selected voltage and said deselected voltage below a breakdown voltage; and wherein during said program procedure, said wordline decoder is configured to apply a first increasingly positive selected voltage in a first voltage range to at least one selected wordline until a first applied voltage is met, and to apply an increased deselected voltage increasing said deselected voltage from one voltage to a more positive voltage to at least one deselected wordline in order to maintain a voltage difference between said selected voltage and said deselected voltage below a breakdown voltage.

42. A method of performing one of an erase procedure and a program procedure in a flash memory having a bank of flash transistors with a plurality of wordlines, a plurality of bitlines and a sourceline, using a wordline decoder having semiconductor devices, comprising the steps of:

for the erase procedure:

(A) applying a first increasingly negative selected voltage in a first voltage range to at least one selected wordline until a first applied voltage is met;

(B) applying a decreased deselected voltage decreasing said deselected voltage from one voltage to a more negative voltage to at least one deselected wordline; and (C) maintaining a voltage difference between said selected voltage and said deselected voltage below a breakdown voltage; and for the program procedure:

(A) applying a first increasingly positive selected voltage in a first voltage range to at least one selected wordline until a first applied voltage is met;

(B) applying an increased deselected wordline voltage increasing said deselected voltage from one voltage to a more positive voltage to at least one deselected wordline; and (C) maintaining a voltage difference between said selected voltage and said deselected voltage below a breakdown voltage.

* * * * *